US007807480B2

(12) United States Patent
Stine et al.

(10) Patent No.: US 7,807,480 B2
(45) Date of Patent: Oct. 5, 2010

(54) TEST CELLS FOR SEMICONDUCTOR YIELD IMPROVEMENT

(75) Inventors: Brian Stine, Livermore, CA (US);
Victor Kitch, Livermore, CA (US);
Mark Zwald, San Jose, CA (US);
Stefano Tonello, Breganze (IT)

(73) Assignee: PDF Solutions, Inc., San Jose, CA (US)

( * ) Notice: Subject to any disclaimer, the term of this patent is extended or adjusted under 35 U.S.C. 154(b) by 111 days.

(21) Appl. No.: 12/002,094

(22) Filed: Dec. 14, 2007

(65) Prior Publication Data

US 2008/0169466 A1 Jul. 17, 2008

Related U.S. Application Data

(63) Continuation of application No. PCT/US2005/021416, filed on Jun. 16, 2005.

(51) Int. Cl.
*H01L 21/66* (2006.01)
(52) U.S. Cl. ............... 438/11; 438/17; 438/18; 438/113; 438/14; 438/12; 257/48; 257/E21.529; 257/E21.531; 257/E21.001; 257/E21.002
(58) Field of Classification Search .................. None
See application file for complete search history.

(56) References Cited

U.S. PATENT DOCUMENTS

| 5,872,018 | A | 2/1999 | Lee et al. |
| 6,630,381 | B1 * | 10/2003 | Hazani ..................... 438/260 |
| 6,737,606 | B2 * | 5/2004 | Peng et al. ............. 219/121.68 |
| 6,781,151 | B2 | 8/2004 | Schultz et al. |
| 6,992,369 | B2 | 1/2006 | Kostylev et al. |
| 2003/0138978 | A1 * | 7/2003 | Tanaka et al. ................. 438/5 |

OTHER PUBLICATIONS

International Search Report mailed Nov. 18, 2005, for PCT Application No. PCT/US05/21416 filed Jun. 16, 2005, 1 page.

* cited by examiner

*Primary Examiner*—Minh-Loan T Tran
*Assistant Examiner*—Fei Fei Yeung Lopez
(74) *Attorney, Agent, or Firm*—Cantor Colburn LLP

(57) ABSTRACT

A test cell for localizing defects includes a first active region, a second active region formed substantially parallel to the first active region, a third active region formed substantially parallel to the first and second active regions, a fourth active region formed between the first and second active regions, and a fifth active region formed between the second and third active regions. The fourth and fifth active regions are formed adjacent to opposite end portions of the second active region. The fourth and fifth active regions are also formed substantially perpendicular to the second active region.

13 Claims, 15 Drawing Sheets

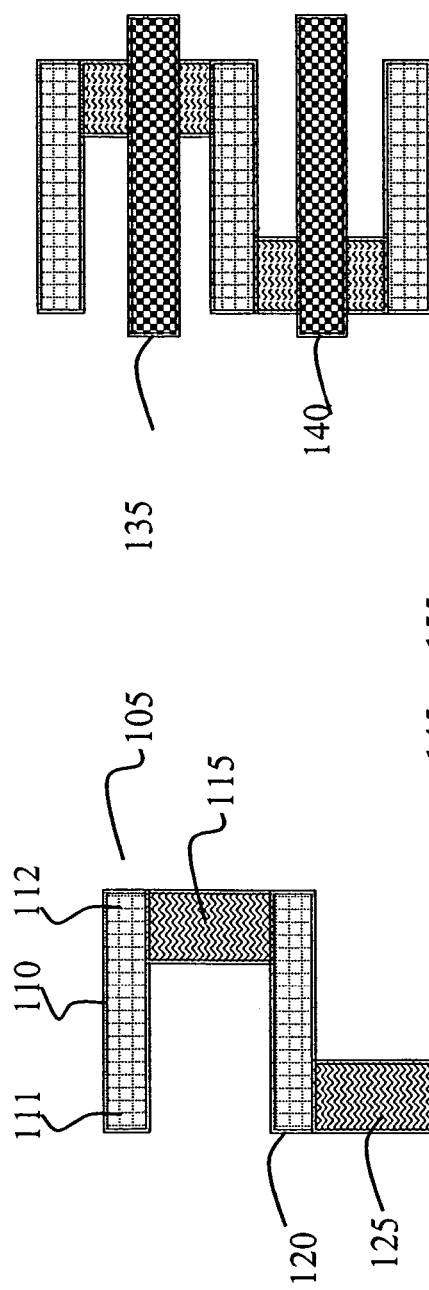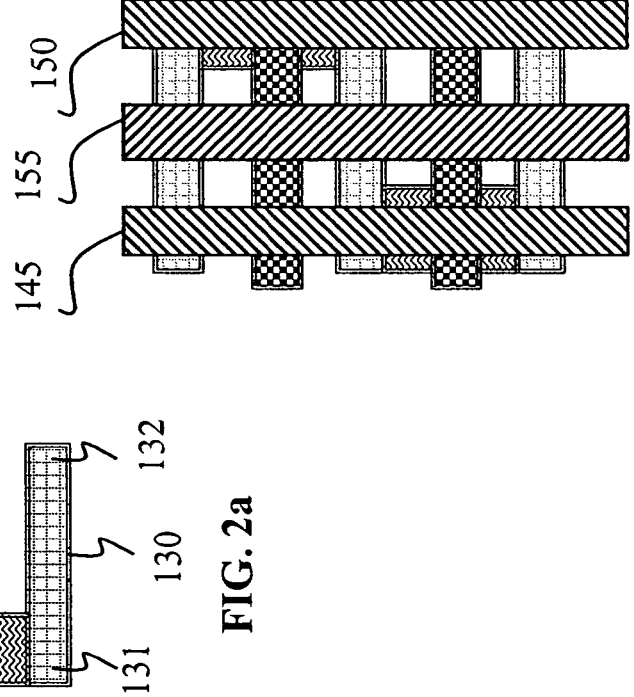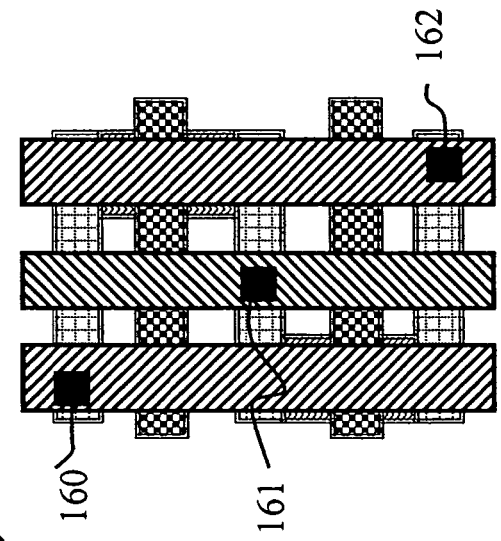

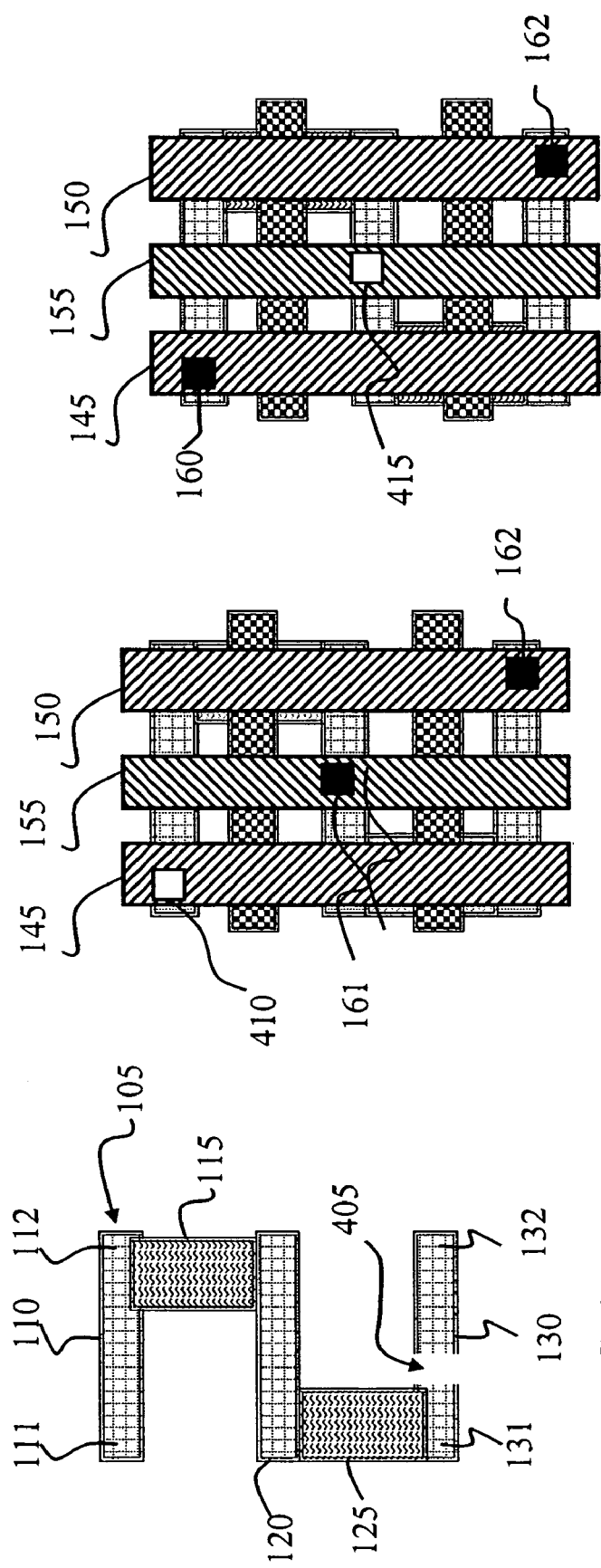

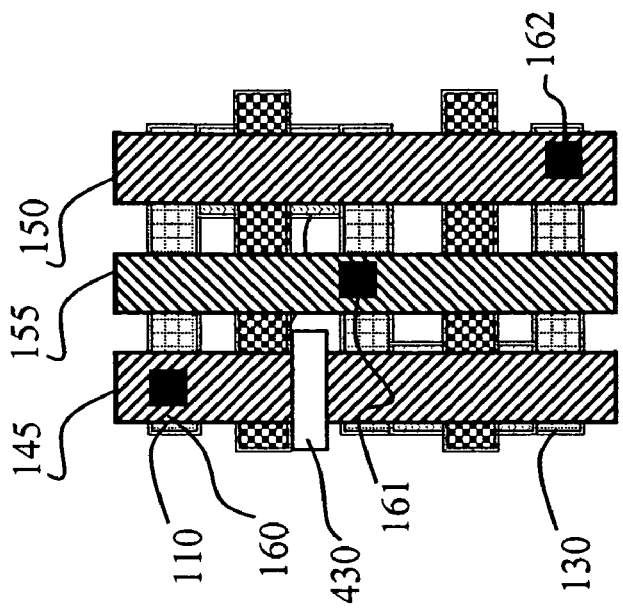
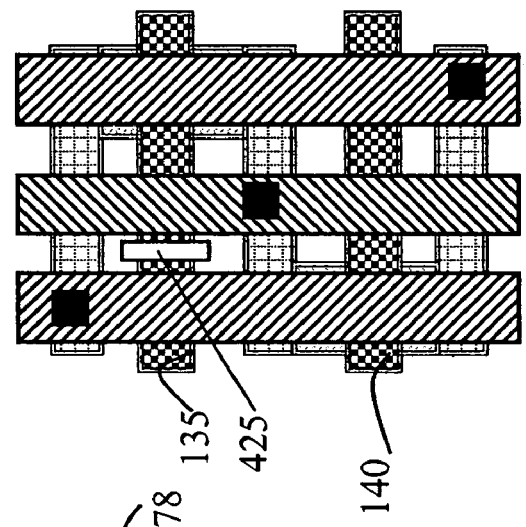
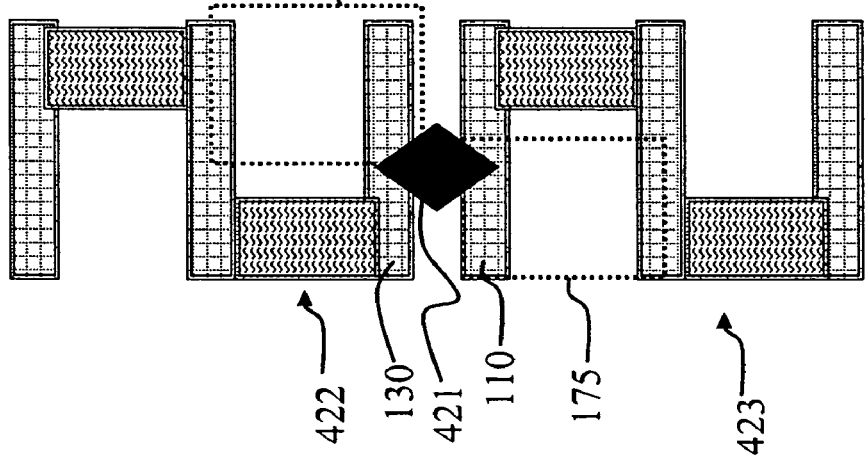

TEST CELLS FOR SEMICONDUCTOR YIELD IMPROVEMENT

CROSS REFERENCE TO RELATED APPLICATION

The present application is a Continuation of PCT Application Number PCT/US2005/021416, filed on Jun. 16, 2005, which is incorporated herein by reference in its entirety for all purposes.

BACKGROUND

1. Field

The present application generally relates to test cells for analyzing semiconductor manufacturing processes, and, more particularly, to test cells to detect and localize defect to improve yield in semiconductor manufacturing processes.

2. Description of Related Art

The fabrication of integrated circuits is a complex process that may involve hundreds of individual operations. The process typically includes the diffusion of precisely predetermined amounts of dopant material into portions of a silicon wafer to produce active regions for producing junctions to be used in devices, such as transistors. Some steps of the process include forming a layer of silicon dioxide on the wafer, then using a photomask and photoresist to define a pattern of areas into which diffusion is to occur through the silicon dioxide mask. Openings may then be etched through the silicon dioxide layer to expose portions of the wafer in the pattern to permit dopant diffusion into those wafer portions.

A number of diffusion operations may be carried out to produce active regions on the wafer for a variety of transistors. Through further processing steps, some of these active regions are coupled to metal interconnects, while other active regions may be covered by a silicon dioxide insulating layer and exposed to electric fields from a line disposed above each region. Such lines and interconnects are typically formed by deposition of electrically conductive material that is defined into a desired interconnect pattern by photomask, photoresist and etching processes.

In exemplary current processes, there may be 10 interconnect layers ("metal layers") with a polysilicon ("poly") gate line disposed over an active region of a transistor. Features disposed at layers connecting one interconnect layer to another interconnect layer (either above or below a given layer) are called vias. Features disposed at layers connecting one interconnect layer to semiconductor active regions are called contacts.

Traditionally, proper functioning of these layers is measured with test structures on a test chip. Test structures for via/contact opens are usually chains of vias/contacts connected serially end to end. A high resistance along is interpreted to mean that there is a via/contact open somewhere in this chain. Test structures for metal opens are usually a long snake of wiring connected at the ends; a high resistance on this snake indicates that there is an open in the snake.

Test structures for short circuits include two combs of wiring connected at either end. A voltage is applied to one comb and current is sensed at the other comb. A significant current above some noise floor indicates a short between the two combs.

These structures are useful for increasing process yield but have limited capabilities. One major limitation relates to defect localization. For defect localization, semiconductor manufacturers typically use some form of physical de-layering followed by other emission or sensitive detection method. Electron microscopy images may be obtained and analyzed for determining a cause of failure.

SRAM memory arrays have also been an aid in localizing defects. A memory array is composed of many rows and columns of memory elements. By constructing such a memory array and analyzing patterns of memory element failure, some information relating to a likely failure layer may be determined. However, this information does not typically result in a complete understanding of failure mode since similar failure symptoms may be caused by a wide variety of different problems.

SUMMARY

In one exemplary embodiment, a test cell for localizing defects includes a first active region, a second active region formed substantially parallel to the first active region, a third active region formed substantially parallel to the first and second active regions, a fourth active region formed between the first and second active regions, and a fifth active region formed between the second and third active regions. The fourth and fifth active regions are formed adjacent to opposite end portions of the second active region. The fourth and fifth active regions are also formed substantially perpendicular to the second active region.

In another exemplary embodiment, an array of test cells for localizing defects includes a first grouping of test cells, a first metal layer that connects the test cells of the first grouping of test cells, and a set of one or more contacts that connect the test cells of the first grouping of test cells to the first metal layer. The array includes a second grouping of test cells. The first grouping is a proper subset of the second grouping. The array also includes a second metal layer that connects the test cells of the second grouping of test cells, and a first set of one or more vias that connect the second metal layer to the first metal layer. Failures in the set of one or more contacts, the first set of one or more vias, or the first and second metal layers are localized based on the number of test cells in the first and second groupings of test structures that fail.

In another exemplary embodiment, a test cell for localizing defects includes a sense line segment and a transistor having a source, drain, and gate. A node is connected to the source or drain of the transistor. The node is separated from the sense line segment by a gap, and the sense line segment is configured to be read to identify a short in the gap.

In another exemplary embodiment, a test cell for localizing defects includes a sense line segment with a test structure connected to the sense line. The test cell also includes a transistor having a source, drain, and gate. A node is connected to the test structure and the source or drain of the transistor. The sense line segment is configured to be read to identify an open in the test structure.

In another exemplary embodiment, a test cell for localizing defects is formed by obtaining an initial design for test structures in the test cell. A failure event matrix is created for the design. The failure event matrix includes correlations between types of failures and symptoms of failures. The failure event matrix is examined to determine an extent of diagonalization of the failure event matrix. If the extent of diagonalization of the failure event matrix is less than an acceptable threshold, the design is modified. If the extent of diagonalization of the failure event matrix meets or exceeds the acceptable threshold, the design is accepted as the final design.

DESCRIPTION OF DRAWING FIGURES

FIGS. 2a-2d depict various portions of the exemplary test cell depicted in FIG. 1;

FIG. 4a-4i depict various failure modes for an exemplary test cell;

DETAILED DESCRIPTION

Exemplary test cells are described below that are designed to focus testing on particular layers deposited during one or more processing steps in semiconductor manufacturing processes. In particular, one or more of the test cells described below are fabricated on a test wafer using an integrated circuit fabrication line, which performs one or more semiconductor manufacturing processes. After the test wafer is fabricated, the one or more test cells are examined to detect and localize defects. Adjustments are made to the integrated circuit fabrication line based on the results of the defect detection and localization to improve the yield associated with the integrated circuit fabrication line. One or more production wafers with integrated circuit dice are then fabricated using the adjusted integrated circuit fabrication line. The production wafers are diced to produce integrated circuit chips, which are then packaged.

Alternatively, integrated circuit dice can be fabricated on a wafer using an integrated circuit fabrication line. One or more of the test cells described below can be fabricated on a portion of a scribe area on the wafer between two adjacent integrated circuit dice on the wafer using the integrated circuit fabrication line. The integrated circuit dice are diced on the wafer along the scribe area into integrated circuit chips, which are then packaged.

Additionally, after the integrated circuit dice and the one or more test cells are fabricated but before the integrated circuit dice are diced, the one or more test cells are examined to detect and localize defects. Adjustments are made to the integrated circuit fabrication line based on the results of the defect detection and localization to improve the yield associated with the integrated circuit fabrication line. One or more subsequent wafers with integrated circuit dice are then fabricated using the adjusted integrated circuit fabrication line. The one or more subsequent wafers are diced to produce integrated circuit chips, which are then packaged.

Test cells and other structures may be described herein using absolute and/or relative directions and orientations. It is to be understood that such directions and orientations are merely exemplary and for aiding in concise description, but in no way limiting as to how such test cells and/or structures may be disposed or formed.

Figure 1:
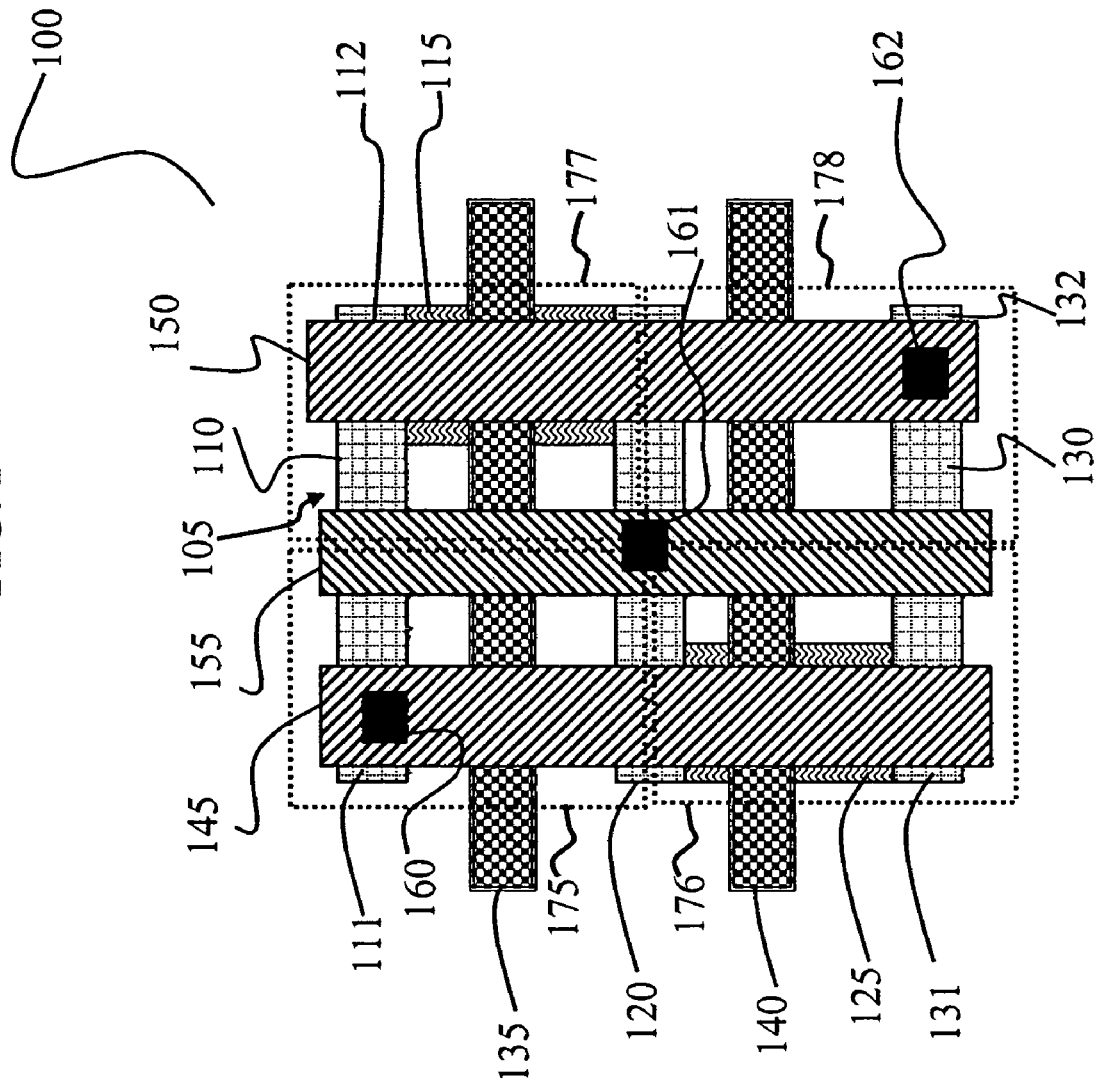
FIG. 1 depicts an exemplary test cell.

FEOL Cell:

FIG. 1 illustrates an exemplary test cell 100 that may be used to detect and localize defects caused during Front End of Line (FEOL) processing steps in a semiconductor manufacturing process. Test cell 100 includes an active layer 105, selection lines 135 and 140, first sense or bit line 145, second sense or bit line 150, and bus line 155.

With reference to FIG. 2a, in one exemplary embodiment, active layer 105 includes active regions 110, 120, and 130, which are formed substantially co-parallel to each other. Active region 115 is formed between active regions 110 and 120. Active region 125 is formed between active regions 120 and 130.

As depicted in FIG. 2a, active regions 115 and 125 are formed adjacent to opposite ends of active region 120. Active regions 115 and 125 are also formed substantially perpendicular to active region 120. In the exemplary embodiment depicted in FIG. 2a, active region 115 is formed adjacent to the right end of active region 120, while active region 125 is formed adjacent to the left end of active region 120. Thus, the shape of active layer 105 resembles an upside-down rectilinear-S shape. It should be recognized, however, that active region 115 can be formed adjacent to the left end of active region 120, while active region 125 is formed adjacent to the right end of active region 120. Thus, the shape of active layer 105 would resemble a rectilinear-S shape.

After active layer 105 is formed, active regions 110, 115, 120, 125, and 130 are appropriately doped so that active layer 105 can be operated as two transistors with common active region 120. In particular, active regions 110, 115, and 120 can be operated as a first transistor, while active regions 120, 125, and 130 can be operated as a second transistor.

For the sake of clarity and convenience, active regions 110, 115, 120, 125, and 130 are described below as being n-doped. Additionally, active regions 110, 130 are described below as being drains, and active region 120 is described below as a source. Thus, active layer 105 can be operated as two NMOS type transistors with a common source (i.e., active region 120). As noted above, it should be recognized, however, that active layer 105 can be operated as two PMOS type transistors with a common drain (active regions 120).

With reference to FIG. 2b, in the present exemplary embodiment, a first polysilicon selection line (SL) 135 is disposed over active region 115, and a second polysilicon selection line (SL) 140 is disposed over active region 125, each for controlling its respective transistor. As illustrated in FIG. 2b, SL 135 and SL 140 run approximately parallel with active regions 110, 120, and 130.

With reference to FIG. 2c, in the present exemplary embodiment, a first bit line (BL) 145 is disposed over active regions 110, 125, and 130, and a second bit line (BL) 150 is disposed over active regions 110, 115, and 130. As depicted in FIG. 2c, BL 145 and BL 150 are disposed over opposite ends of active regions 110, 130. Additionally, BL 145 and BL 150 run approximately perpendicular to SL 135 and SL140. BL 145 and BL 150 can be formed as metal layer 1 (M1).

In the present exemplary embodiment, a bus line 155 is disposed between BL 145 and BL 150, and runs approximately parallel between BL 145 and BL 150. Additionally, bus line 155 is disposed over active region 120. Bus line 155 may be formed at metal layer 1 (M1).

With reference to FIG. 2d, in the present exemplary embodiment, a contact 160 couples first bit line 145 with active region 110. A second contact 162 couples second bit line 150 with active region 130. A third contact 161 couples bus line 155 with active region 120.

With reference again to FIG. 1, test cell 100 may be divided into quadrants defined by vertically bisecting the test structure through a middle of the active regions 110, 120, and 130, and by horizontally bisecting active region 120. The resulting quadrants include a top left quadrant 175, a top right quadrant 177, a bottom left quadrant 176, and a bottom right quadrant 178.

Analogizing test cell 100 to a cell of a ROM structure, each of quadrants 175-178 may be viewed as a single bit memory location, where each of the top left 175 and bottom right 178 quadrants stores the same bit (both either 1 or 0), while the top right 177 and bottom left 176 quadrants each store a bit opposite to that of the top left 175 and bottom right 178 quadrants. Thus, the test cell may be analogized to a ROM cell programmed with diagonal 1's and 0's.

Failures discussed below may reference failures of particular bits, which are intended to refer to one or more quadrants of one or more test cells. As will be discussed further below, by activating portions of test cell 100 and determining whether a sensed output is equal to an expected output (a bit read from a given bit line matches a bit expected to be read on the bit line), failures may be detected. Further, by analyzing ways in which the actual output differs from the expected output, failure types and locations may be better understood. Failures and behavior of other test cells may be used for further insight into how a given test cell failed.

Figure 3:
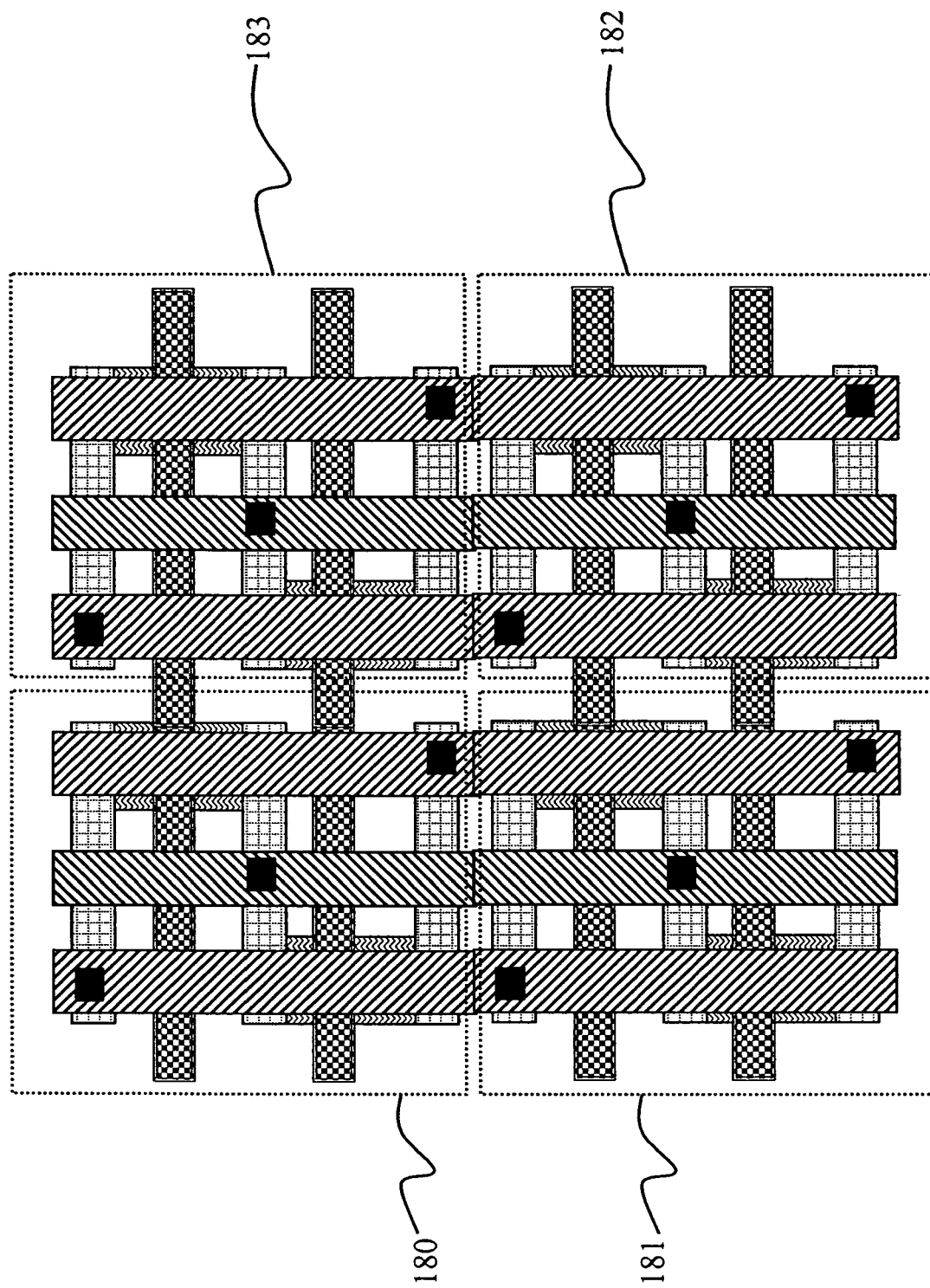
FIG. 3 depicts an exemplary array of test cells.

As illustrated in FIG. 3, test cell 100 may be replicated horizontally and vertically as elements 180-183 of an array of test cells. In the array, bit lines may be shared with test cells both above and below a given test cell, and selection lines may be shared with test cells both to the left and to the right of the given test cell. Thus, the array may be disposed on a semiconductor surface, each having a separate active region, and each may share bit lines and selection lines in common with some other test cells. The array facilitates faults (failure modes) to be electrically detected and localized.

By example, an array of test cells may be disposed on a semiconductor surface, each having a separate active region. Selection line segments may be disposed along rows of the array and bit lines may be disposed along columns of the array. A selection line segments may be disposed for controlling each row of transistors in the array, and because test cell 100 contains two transistors, each transistor of test cells in a row may be considered as aligned to a sub-row.

FIGS. 4a-i depict various failure modes for test cell 100, which can be used to detect and localize defects. It should be recognized that the failure modes depicted in FIGS. 4a-i and described below are illustrative and not meant to be comprehensive.

FIG. 4a depicts a first failure mode that may occur if a portion of active layer 105 becomes open, such as might occur if dopants were not implanted properly. As illustrated in FIG. 4a, an open 405 has occurred in active region 130 of active layer 105 between first portion 131 and second portion 132 thus isolating contact 162 (coupling bit line 150 to second portion 132 as illustrated in FIG. 2d) from the source of current (active region 120). If SL 140 is activated and BL 150 is sensed, a state of BL 150 as sensed will not be as expected. In other words, no current can flow from/to bus line 155 through active layer 105 to/from BL 150, where current flow is expected.

By analogy to a ROM cell, a bit stored in bottom right quadrant 178 will be read incorrectly. However, no other bit would fail because only that portion of active layer 105 is affected. Moreover, if a bit stored in the bottom left quadrant (which shares active region 130 with the bottom right quadrant) is "read" by activating BL 145 and SL 140, that value will be "read" properly since a value consistent with no coupling (no current flow) between BL 145 and active region 130 was expected. As would be understood, such an active layer 105 open would produce a similarly detectable event if the open occurred in active region 125 or in the portion of active region 120 shared between the top left and bottom left quadrants because in all such cases, current flow is interrupted between active region 120 and BL 150.

In sum, the first failure mode evidences single "bit" failures in test cell 100. More particularly, the single bit failures will be evidenced at one end of the s-shaped active layer, where contacts couple active layer 105 to BL 145 and BL 150. If an open occurs in both active regions 110 and 130, both the top left and bottom right quadrant would fail to be read properly. However, such a scenario is statistically improbable and would again be localizable by evidence of a diagonal failure of top left quadrant and bottom right quadrant.

FIG. 4b depicts a second failure mode that may occur if a contact 410 coupling BL 145 to active region 110 becomes open (or BL 150 to active region 130). This failure (contact 410 open) may cause an incorrect reading in the top left quadrant. However, top right quadrant 177 and bottom left quadrant 176 are unaffected. In terms of a ROM, the first failure mode and the second failure mode are each single bit failure modes that are evidenced by failures in quadrants where respective bit lines are coupled with respective drains.

FIG. 4c depicts a third failure mode, which is related to failure mode 410, that may occur if contact 415 (an instance of contact 161) fails to couple bus line 155 with active region 120. In this failure mode, both top left quadrant 175 and bottom right quadrant 178 fail to be read properly (i.e., they indicate information opposite to what was expected if no failure occurred). Thus, drain contact failures may be differentiated from source contact failures by whether there is a single or double bit failure because it is statistically improbable that both drain contacts (which would result in a double bit failure) would fail as compared with the single contact 415. In terms of a ROM, this failure is symptomatic of a down-slope diagonal 2 bit failure.

FIG. 4d depicts a fourth failure mode that may occur if active region 130 shorts to active region 110 of a neighboring test cell, as illustrated by contaminant 421 shorting active region 130 of upper test cell 422 with active region 110 of lower test cell 423. In this failure mode, bottom right quadrant 178 of upper test cell 422 and top left quadrant 175 of lower test cell 423 fail. This failure mode may thus be characterized by failure of two forward-sloped diagonally opposed quadrants. This failure mode may be differentiated from other failure modes, including failure of contact 161 to couple bus line 155 with active region 120, as failure of contact 161 is a backward sloped diagonal quadrant failure. The fourth failure mode may also be evidenced by shorting of active layers of two diagonally disposed test cells, rather than 2 test cells directly above/below. This variation is also characterized by forward-sloped diagonal quadrant failure, but with more spacing between the failing quadrants. Spacing between columns of test cells may be adjusted to make this variation statistically insignificant.

Figure 4I:
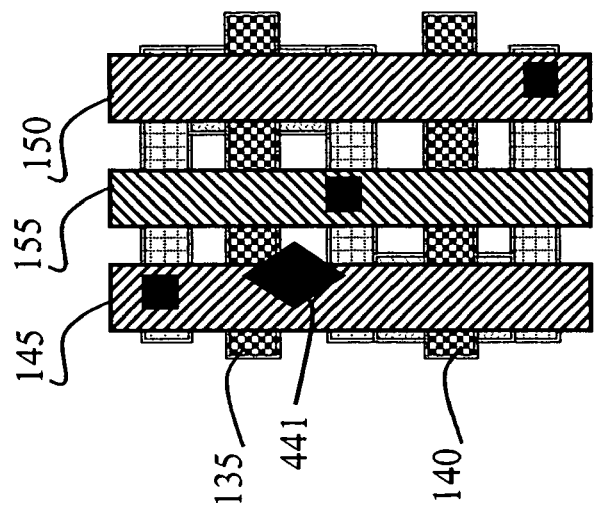
Figure 4H:
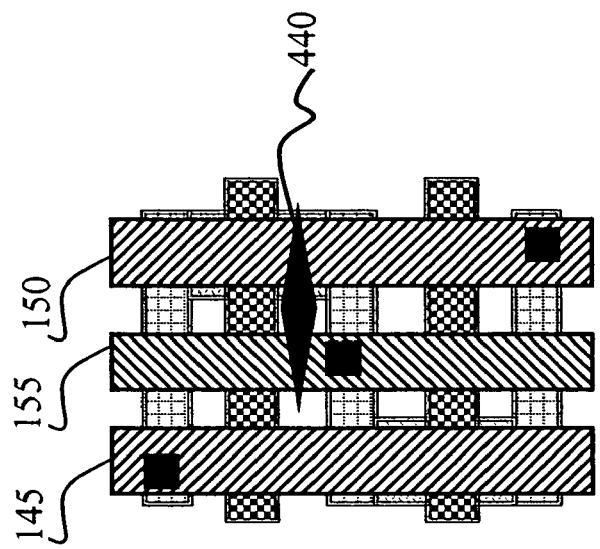
Figure 5:
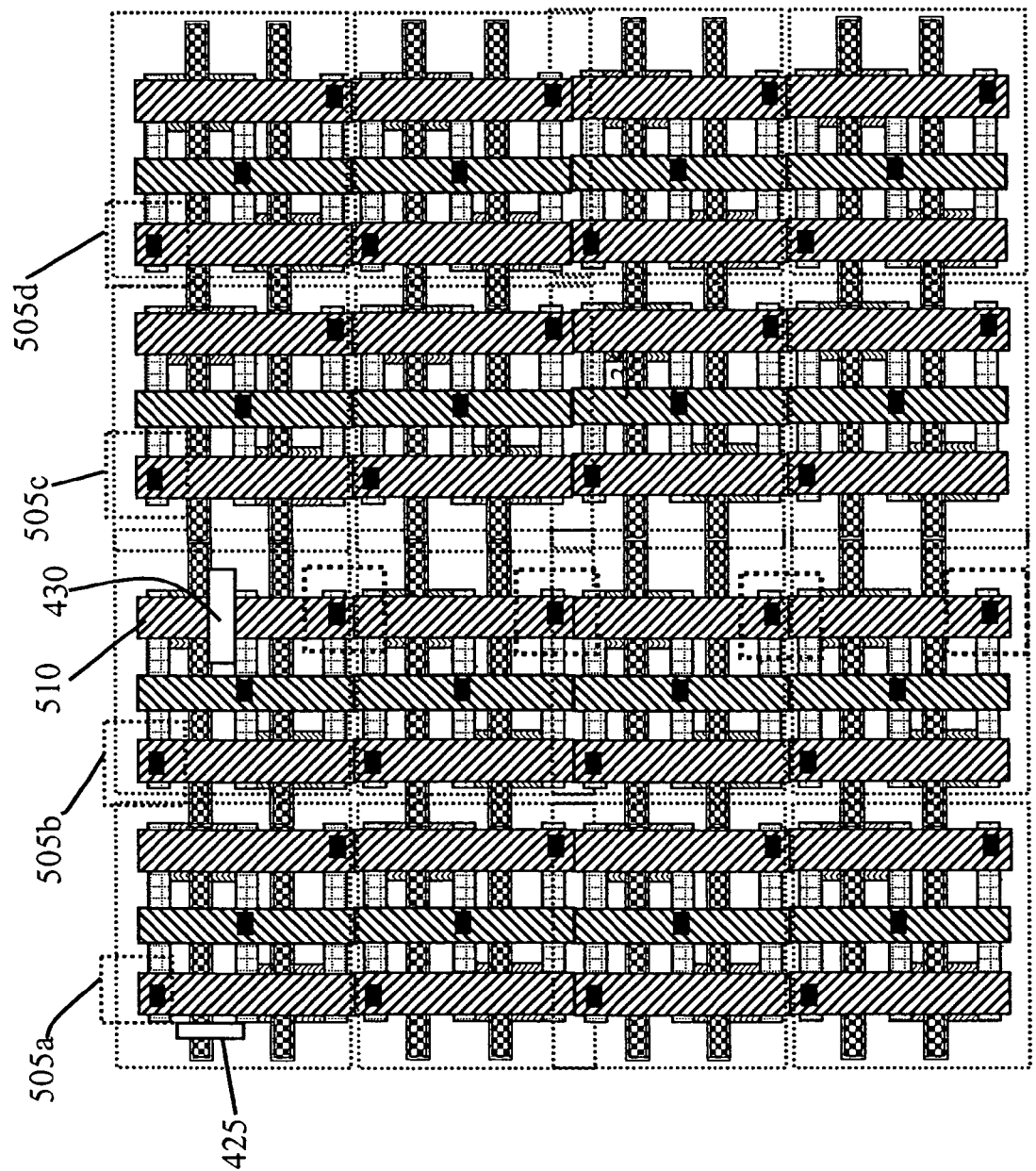
FIG. 5 depicts an open in an exemplary array of test cells.

FIG. 4e depicts a fifth failure mode that may occur if there is an open at some point along SL 135 or SL 140, as illustrated by SL open 425 in SL 135. A failure of the fifth mode is detectable where test cells 100 are tiled, such as in FIG. 3, by a failure of all test cell quadrants to the right of the SL open (assuming a source of voltage to the left of open 425). In implementations, each SL, such as SL 135 and SL 140, may be run in polysilicon for a limited number of test cells (e.g., 8 test cells). Each selection line in polysilicon may thus be considered a selection line segment, and each selection line segment may be coupled using a metal interconnection, such that there is a hierarchical selection line that prevents losses associated from long polysilicon lines. In such implementations, the fifth failure mode may be further characterized by identifying a failure of 8 or fewer test cell quadrants along the same selection line segment. Analogizing to a ROM, the fifth failure mode evidences a failure of 8 or fewer bits selectable by the same SL. For example, FIG. 5 illustrates open 425 in a context of a larger array of test cells. In FIG. 5, bits 505a-d, which have failed due to open 425, are selectable by the selection line. The fifth failure mode may be distinguished from a failure of a metal line that couples polysilicon selection line portions, as will be discussed herein.

FIG. 4f depicts a sixth failure mode that may occur if there is an open in a bit line, such as open 430 in BL 145. Provided that sensing circuitry is disposed toward a top end of the test structure of which the test cell of FIG. 4f is a part, this failure is identifiable by a failure of test cells more distal the top end of the test structure than open 430 and by proper reading of test cells more proximate the top end than open 430. By example, in FIG. 4f, open 430 in BL 145 is between active regions 110 and 130. Assuming sense circuitry on BL 145 above active region 110, top left quadrant 175 will be read properly but all quadrants disposed below active region 110 on BL 145 will fail to be read properly because a current flow expected to be sensed on BL 145 below active region 110 will be absent. Referring to FIG. 5, dashed boxes around contacts on BL 510 below open 430 identify bits failing due to open 430. By analogy to a ROM, the illustrated bits in FIG. 5 will be read as storing a value opposite to that expected.

Figure 4G:
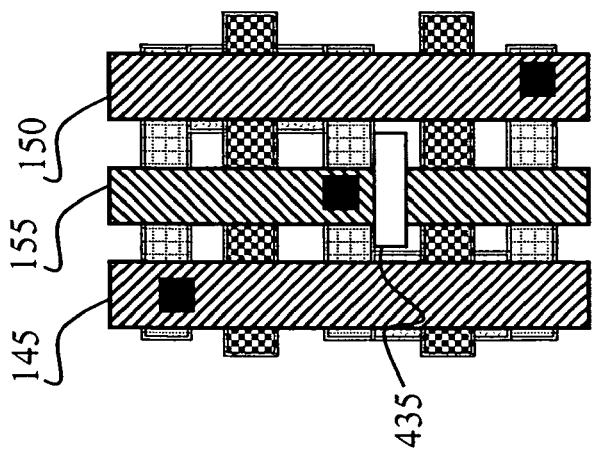

A related failure mode is illustrated in FIG. 4g. An open 435 in bus 155 causes all quadrants of all test cells on BL 145 and BL 150 below the open to fail. A sensitivity of a test cell or group of test cells to metal opens in bit lines and bus lines may be adjusted. For instance, some test cells may be made relatively insensitive to bus opens by increasing a difference between widths of bus lines and bit lines (making bus lines relatively wide) while other test cells may be made relatively insensitive to bit line opens by making bit lines for those test cells relatively wide compared with a corresponding bus line. An entire row, an entire column, or an entire test structure may be made insensitive or sensitive to one or more failure modes.

A seventh failure occurs if there is a short between a bit line and a power bus or between bit lines of neighboring test cells. By example, in FIG. 4h, BL 150 is shorted by contaminant 440 to bus 155. BL 145 may also or alternatively short to a bit line of a neighboring test cell. Where there is a short between a bit line and a bus line, all quadrants where a contact to the bit line does not exist will fail (because unexpected voltage and/or current flow is detectable in the bit line). Where two bit lines short, this failure is evident when one of the shorting bit lines is activated and current flow (and/or voltage change) is detectable in the other of the shorting bit lines that was not activated. If the short is bus line to bit line, then incorrect values for quadrants on the bit line are sensed when there is attempt to read quadrants where no contact exists. Thus, the seventh failure mode may be differentiated from the others, and each of two sub-modes (bus line to bit line and bit line to bit line) may be further differentiated from each other.

An eighth failure mode occurs if there is a short between a poly selection line (such as SL 135 or SL 140) and another structure, such as bus 155, BL 145, or active layer 105 (such as illustrated by contaminant 441 in FIG. 4i). This failure causes quadrants activated by that selection line to fail. The symptoms of such a failure depend to some extent on the structure to which the selection line shorted. For example, if the selection line shorted to a bit line, then the failure would be evident when that bit line was activated. However, this short would also be evidenced by a failure of quadrants coupled with the shorted bit line when the selection line and a different unshorted bit line were activated, since an unexpected change in voltage would be detectable on the shorted bit line upon activation of the selection line. As another example, if SL 135 and SL 140 were shorted together, all bit test cells selectable by these selection lines would fail.

A ninth failure mode relates to how a selection line run at M2 is brought down to a poly local selection line segment coupling a run of 8 bit test cells (exemplary, as discussed with regard to the fifth failure mode). In examples, M2 couples to M1 with a via and M1 couples to poly through a contact. If either the via or the contact fails, then exactly those 8 bit test cells fail.

Finally, if there is an open in an M2 portion of a selection line (i.e., a global selection line coupling local selection line segments), then all test cells past the open fail (typically, more than 8 test cells). If an M2 selection line (e.g., SL 135) were to short, then all bit test cells selectable by that selection line would fail, rather than merely those past the defect. Thus, an M2 selection line short has symptoms like those of failure mode eight and is therefore not separately identified as a failure mode.

Table 1, below, provides a summary of failure modes described above and detectable symptoms of those failure modes.

TABLE 1

Failure symptoms correlated to physical failure modes

| | Failure mode | | | | | | | | | |
|---|---|---|---|---|---|---|---|---|---|---|
| Symptom | Active Short | Active Open | SL Short | SL open | Contact to Active Open | Metal to Poly open | M1 Short | M1 open | M2 short | M2 open |
| Single | | X | | | X | | | | | |
| Down slope diagonal 2 bit | | | | | X | | | | | |
| Up slope diagonal 2 bit | X | | | | | | | | | |
| Partial SL Segment | | | X | | | | | | | |
| Whole SL Segment | | | | | | X | | | | |
| Multiple SL Segments | | | | | | | | | | X |
| Entire SL or double SL | | | | X | | | | | X | |
| Partial BL | | | | | | | | X | | |
| Whole BL | | | | | | | X | | | |

Figure 6:
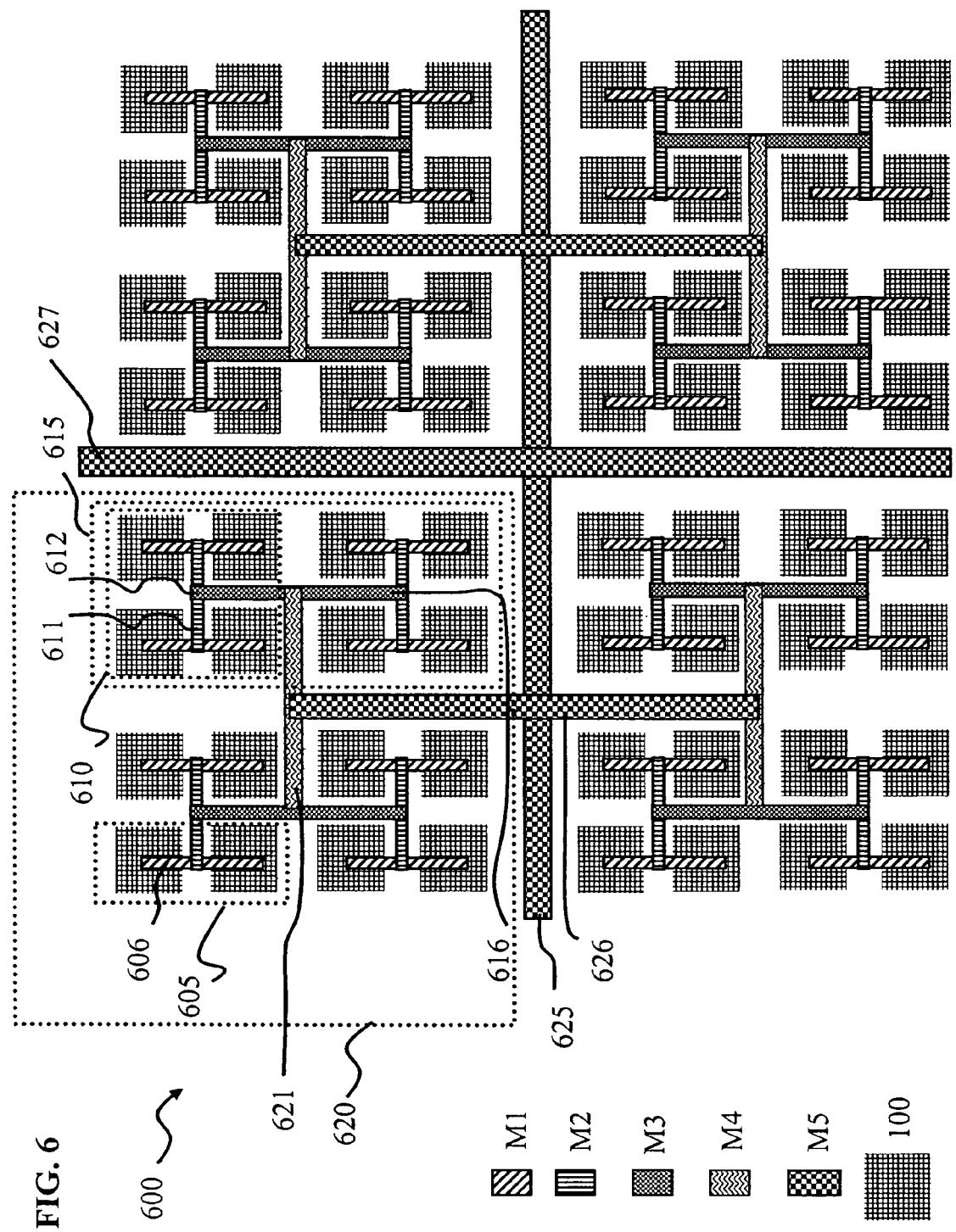
FIG. 6 depicts an exemplary array of test cells used to detect and localize defects.

Via Fault Detection and Localization:

With reference to FIG. 6, an array of test cells can be used to detect and localize defects. By arranging groups of test cells 100 into various hierarchical groupings coupled by different metal layers, opens in metal lines and vias may be detected and localized.

For example, a first grouping may have 2 test structures arranged as 2 rows and 1 column, then the next grouping may have 4 test structures arranged as 2 rows and 2 columns, then the third grouping may have 8 test structures arranged as 4 rows of 2 columns each, and etc. Each grouping may be locally connected with one layer of metal and connect with lower and higher level grouping in the hierarchy through vias. Such an arrangement permits localization to metal layers or vias by determining how many test cells fail and the arrangement of failing test cells.

Each such grouping of test cells 100 may be configured to detect and localize different defects. By example, including multiple vias between metal layers may increase sensitivity of an arrangement to metal opens and decrease sensitivity to via failures. By further example, including wider metal lines in another arrangement makes that arrangement more sensitive to via failures. Multiple such arrangements having various combinations of via counts and metal line width may be disposed on a single semiconductor wafer to construct a thorough diagnostic for detecting and/or localizing via failures and metal opens.

By example, FIG. 6 illustrates an exemplary array 600 comprising groupings of test cells 100 coupled with an exemplary metal interconnect pattern functioning as either a power or a ground bus. In array 600 test cells 100 are arranged in rows and columns and coupled hierarchically, such that bottom metal layers serve fewer test cells than higher metal layers. Vias coupling metal layers have been omitted for clarity, but are understood by those of skill in the art to be present. In this example, the next highest metal layer couples twice as many test cells to the next highest layer (e.g., M3 couples twice as many test cells to M4 as M2 couples to M3).

Also, some metal lines serve non-square arrangements of test cells 100 while others serve square arrangements. By example, M1 couples 2 rows and 1 column of test cells 100 with M2, M2 couples couple 2 rows and 2 columns of test cells 100 with M3, M3 couples 4 rows and 2 columns with M4 while M4 couples 4 rows and 4 columns with M5. By arranging different metal layers to couple with different numbers and/or different arrangements (rows and columns) of test cells 100, array 600 may produce information interpretable for localizing failures.

In the exemplary embodiment depicted in FIG. 6, M1 segment 606 couples 2 test cells 100, identified as M1 element 605, with M2. Thus, M1 segment 606 serves as power bus 155 for both test cells 100 in M1 element 605, such that M1 couples 2 rows and 1 column of test cells 100 to the next higher metal layer (M2). Failures detectable by this arrangement include M1 contact opens, which would result in detection of a failure of a single test cell 100 in M1 element 605. If a via coupling M2 to M1 becomes open then both test cells 100 in M1 element 605 would fail.

M2 element 610 comprises 2 M1 elements 605 coupled by M2 segment 611 to an M3 segment 612. Thus, M2 serves a total of 4 test cells 100, arranged into 2 rows and 2 columns. A single open in M2 thus would cause one of the M1 elements 605 in M2 element 610 to fail (i.e., 2 test cells 100, arranged as 2 rows of 1 column). This failure mode may be contrasted with an M1 open, which may be detected by a single test cell 100 failing. If a via formed between M2 and M3 were to fail then both M1 elements 605 in M2 element 610 would fail, which would be a failure event detectable by noticing that 4 test cells 100, arranged as 2 rows and 2 columns failed. Likewise an open at M3 would cause both M1 elements 605 in M2 element 610 to fail.

M3 element 615 comprises 2 M2 elements 610, the M2 elements arranged such that the arrangement of test cells 100 in M3 element 615 is that eight test cells are arranged into 4 rows of 2 columns each. M3 segment 616 couples the 2 M2 elements 610 in M3 element 615. A single open in M3 thus would cause one of the M2 elements 610 to fail (i.e., 4 test cells 100, arranged as 2 rows of 2 columns each). If a via formed between M3 and M4 were to fail then both M2 elements 610 in M3 element 615 would fail, which would be a failure event detectable by noticing that eight test cells 100, arranged as 4 rows and 2 columns had failed. Likewise, an M4 open would cause both M2 elements 610 in M3 element 615 to fail.

M4 element 620 comprises 2 M3 elements 615, the M3 elements arranged such that the ultimate arrangement of test cells 100 in M4 element 620 is that 16 test cells are arranged into 4 rows of 4 columns each. M4 segment 621 couples the 2 M3 elements 615 of M4 element 620. A single open in M4 thus would cause one of the M3 elements 615 to fail (i.e., eight test cells 100, arranged as 4 rows of 2 columns each). If a via formed between M4 and M5 were to fail then both M3 elements 615 would fail, which would be a failure event detectable by noticing that sixteen test cells 100, arranged as 4 rows and 4 columns had failed. Likewise, an M5 open would cause both M2 elements 615 in M3 element 615 to fail.

Finally, array 600 comprises 4 M4 elements 620, the M4 elements arranged such that the ultimate grouping of test cells 100 in array 600 is that 64 test cells are arranged into eight rows of eight columns each. M5 segment 626 couples 2 M4 elements 620 with M5 segment 625, which in turn couples with M5 segment 627. Thus, a single M5 open causes at least a 4×4 pattern test cells to fail, and may cause an 8×4, 4×8, or 8×8 pattern to fail as well (depending on how M5 receives power or ground).

Such groupings of test cells 100 and metal lines may continue to be replicated for layers higher than M5 for processes having more metal layers. Other groupings of test cells 100 and metal lines are possible. For instance, metal lines that couple 2×1 test cells may couple 1×2 elements cells, groups may be differently sized, and the like. Array 600 is orientation neutral and could be formed at any angle on a semiconductor plane.

Table 2 provides a summary of failure modes and symptoms thereof, as described above. In each column, the opens are described. For instance, contact opens and M1 opens are evidenced by a 2×2 test cell failure, while a via open between M1 and M2 and an M2 open are evidenced by a 2×4 test cell failure, and etc.

TABLE 2

Test cell Failure Symptoms correlated to physical failure modes

| | Type of open failure | | | | |
|---|---|---|---|---|---|
| Symptom | Contact M1 | V12 M2 | V23 M3 | V34 M4 | V45 M5 |
| 2 × 2 cells fail | X | | | | |
| 2 × 4 cells fail | | X | | | |
| 4 × 4 cells fail | | | X | | |
| 4 × 8 cells fail | | | | X | |
| 8 × 8 or more cells fail | | | | | X |

Figure 7:
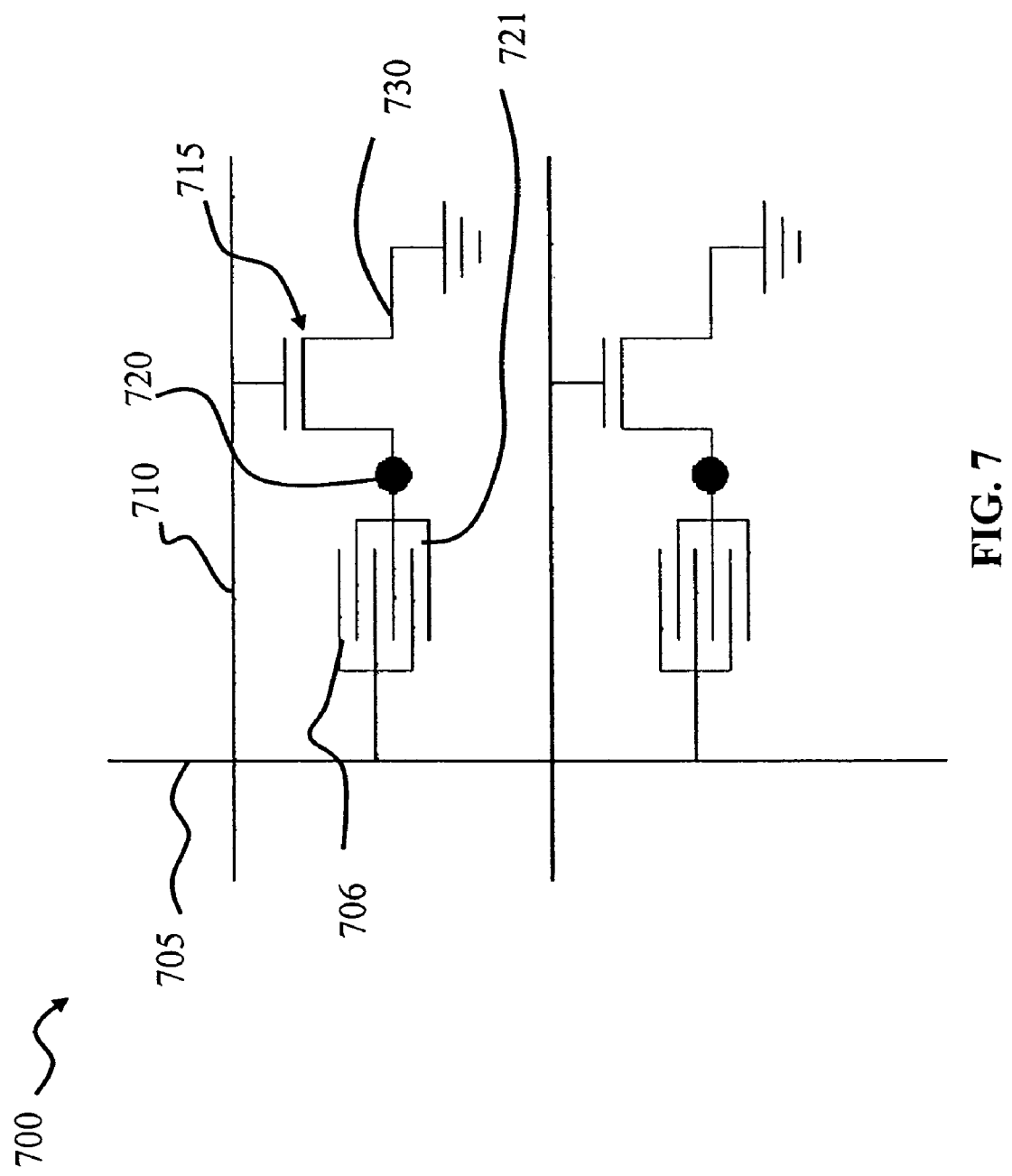
FIG. 7 depicts an exemplary test cell.

Metal Short Detection:

Turning now to FIG. 7, an exemplary test cell 700 for detecting whether a given fabrication process may cause shorts, and for localizing such shorts, in one or more metal layers is illustrated. Test cell includes a transistor 715 having a source, drain, and gate. A node 720 is connected to the source or drain of transistor 715. Node 720 is separated from a bit line 705 by a gap. Bit line 705 can be read to identify a short in the gap. Test cell 700 also includes a selection line 710 for controlling the gate of transistor 715.

In the exemplary embodiment depicted in FIG. 7, a comb structure is disposed between node 720 and bit line 705. The comb structure includes a set of tines 706 connected to bit line 705 and a set of tines 721 connected to node 720. As depicted in FIG. 7, sets of tines 706 and 721 intermesh without contacting each other to define gaps between alternating tines. Thus, bit line 705 can be read to identify a short in the gaps defined between alternating tines. Note that the intermeshing of set of tines 706 and 721 may be designed to control this sensitivity by altering the number of tines and/or spacing between intermeshed tines.

The comb structure and bit line 705 may be replicated at each metal layer to be tested. For example, one set of comb structure and bit line 705 can be formed in a first metal layer, and another set of comb structure and bit line 705 can be formed in a second metal layer. Both comb structures are connected to the same transistor. The bit lines at the first and second metal layers can be connected to a multiplexer, and read to detect and localize defects to the first or second metal layer.

Figure 8:
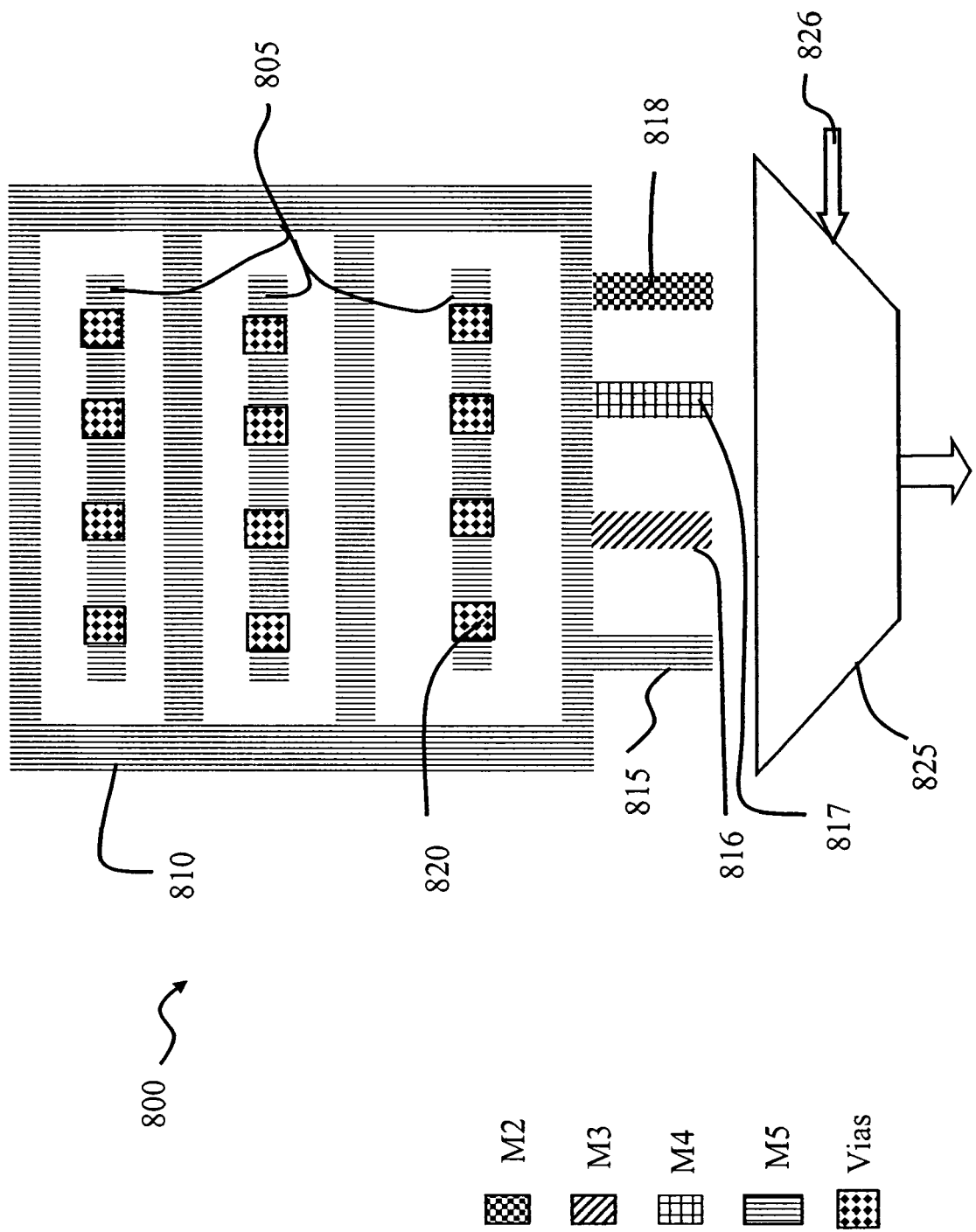
FIGS. 8 and 9 depict top views of exemplary test cells.

FIG. 8 depicts a top view of another exemplary test cell 800. In this exemplary embodiment, nodes 820 are formed on islands 805. Bit lines 810 are formed around islands 805 with a gap around each island 805 to isolate each island 805 from the surrounding bit lines 810. Island 805 extend up through the various metal layers, while there is a separate bit line (i.e., bit lines 815, 816, 817, 818) for different metal layers. The separate bit lines are connected to a multiplexer 825, which can be controlled using control line 826 to read any particular bit line to detect and localize defect in a particular metal layer.

Figure 9:
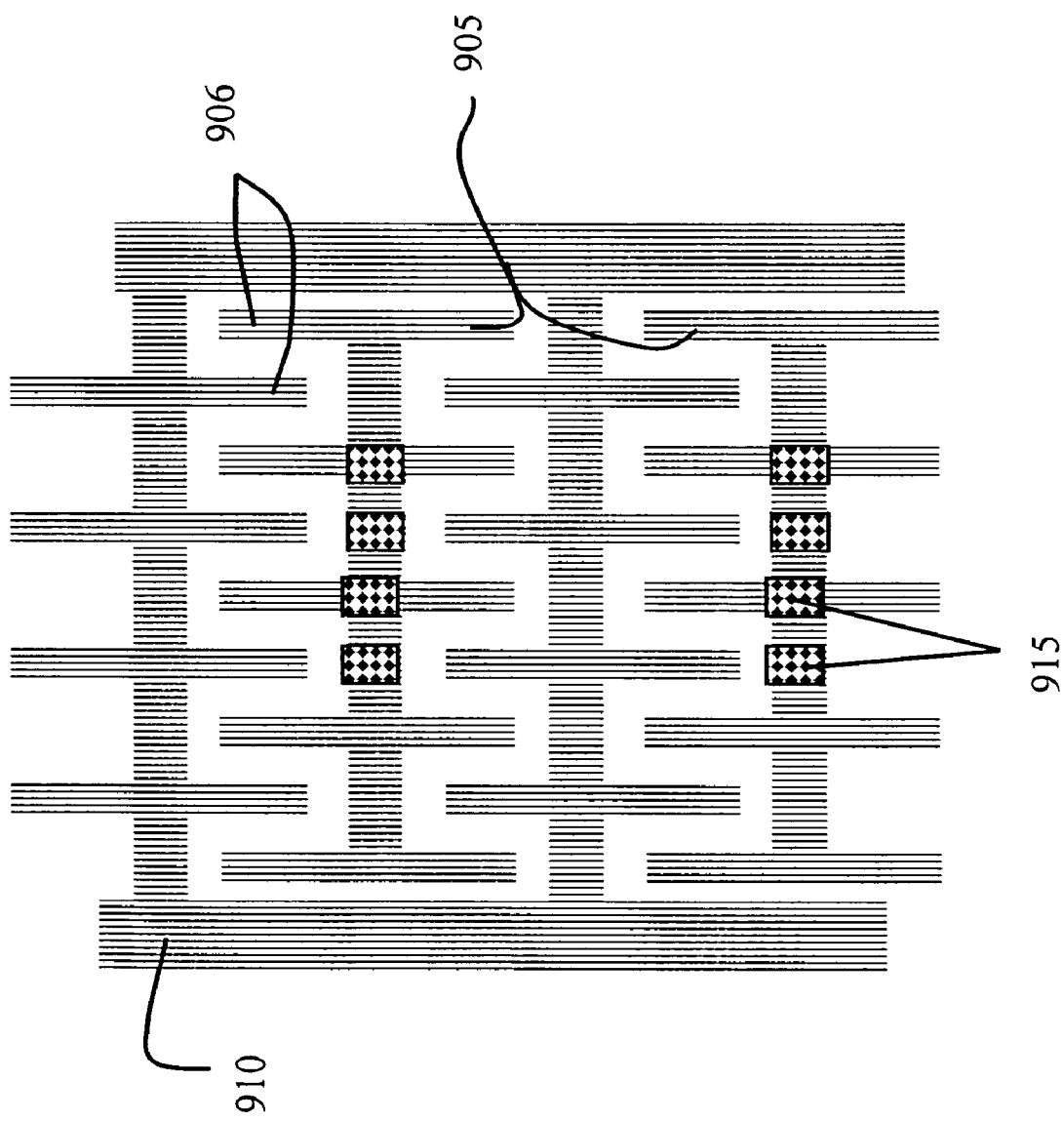

FIG. 9 depicts a top view of still another exemplary test cell. In this exemplary embodiment, bit lines 910 include a set of tines 906 extending from bit lines 910 toward the islands. The islands with nodes 915 include a set of tines 906 extending from the islands toward the surrounding bit lines 910. Sets of tines 906 and 910 facilitate further control of short sensitivity to various contaminants.

Figure 10:
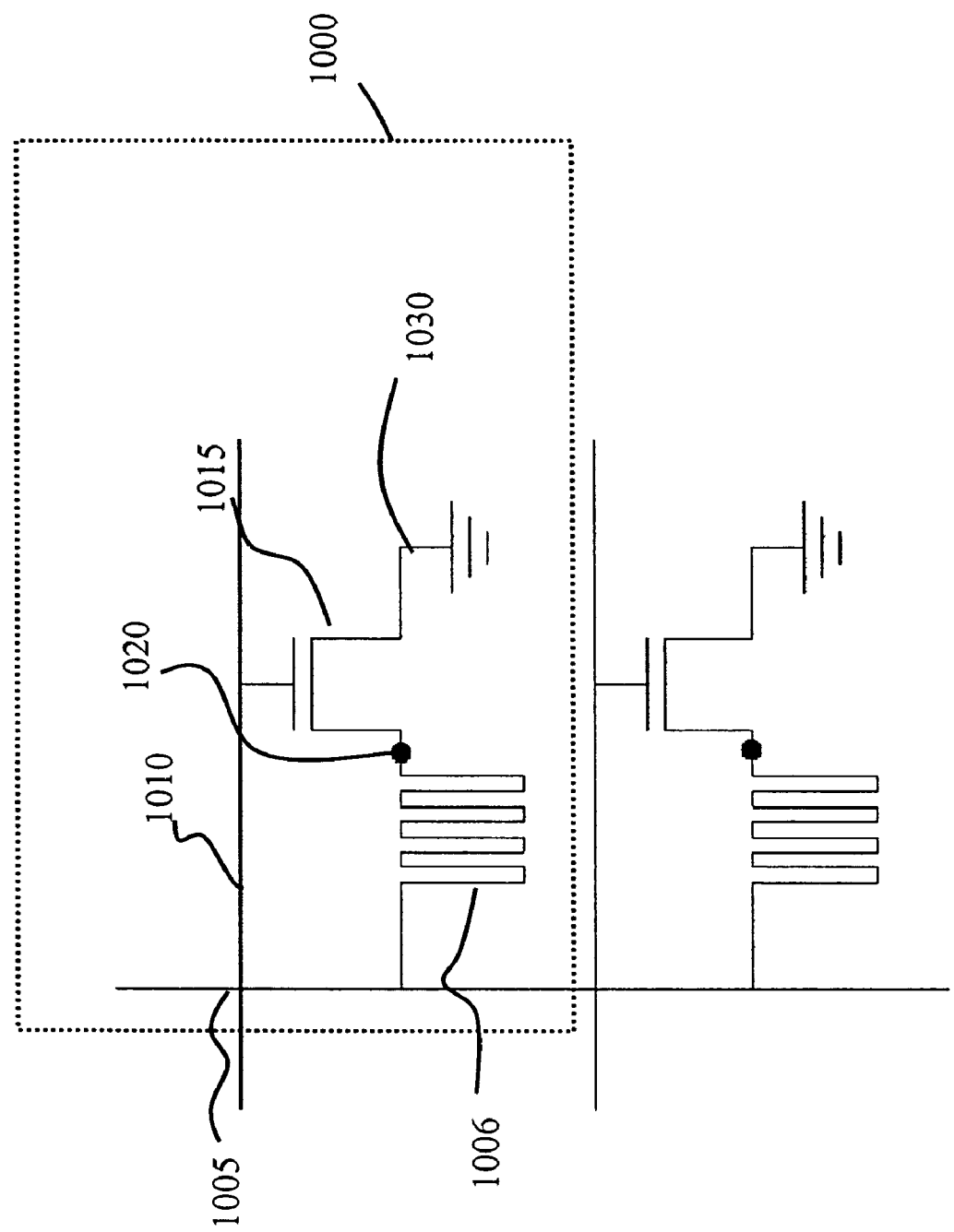
FIG. 10 depicts a schematic of another exemplary test cell.

Metal Opens Detection:

FIG. 10 illustrates a schematic of an exemplary test cell 1000 that may be used for detecting and/or localizing an open in one or more metal layers and/or vias disposed during fabrication. In some aspects, a metal line 1006 may "zig zag" at a given metal layer such that a number of parallel metal line portions are disposed proximate each other. In some aspects, metal line 1006 may include a number of metal line segments disposed at different metal layers and coupled by one or more vias between each metal layer of metal line 1006. In some aspects, metal line 1006 may include "zig zag" portions disposed at multiple metal layers and coupled by one or more vias between each metal layer of metal line 1006. An amount of zig zagging at a given metal layer may be used to control sensitivity to opens at that layer. Another way to control sensitivity to opens at a given metal layer is by adjusting the width of the metal line.

Regardless of how the above metal line aspects are used, one end of metal line 1006 may be coupled to bit line 1005 and another end of metal line 1006 may be coupled with a source 1020 of transistor 1015. A gate of transistor 1015 is coupled to selection line 1010. A drain 1030 of transistor 1015 is coupled to one of a source and a sink of electrical current (depending on whether bit line 1005 is designed to source or sink current in a particular design).

Test cells 1000 may be replicated as an array on a given substrate or portion of semiconductor. The array may include variations in layout and connection of metal line 1006 amongst test cells 1000 or amongst different groups of test cells 1000.

Figures 11A, 11B:
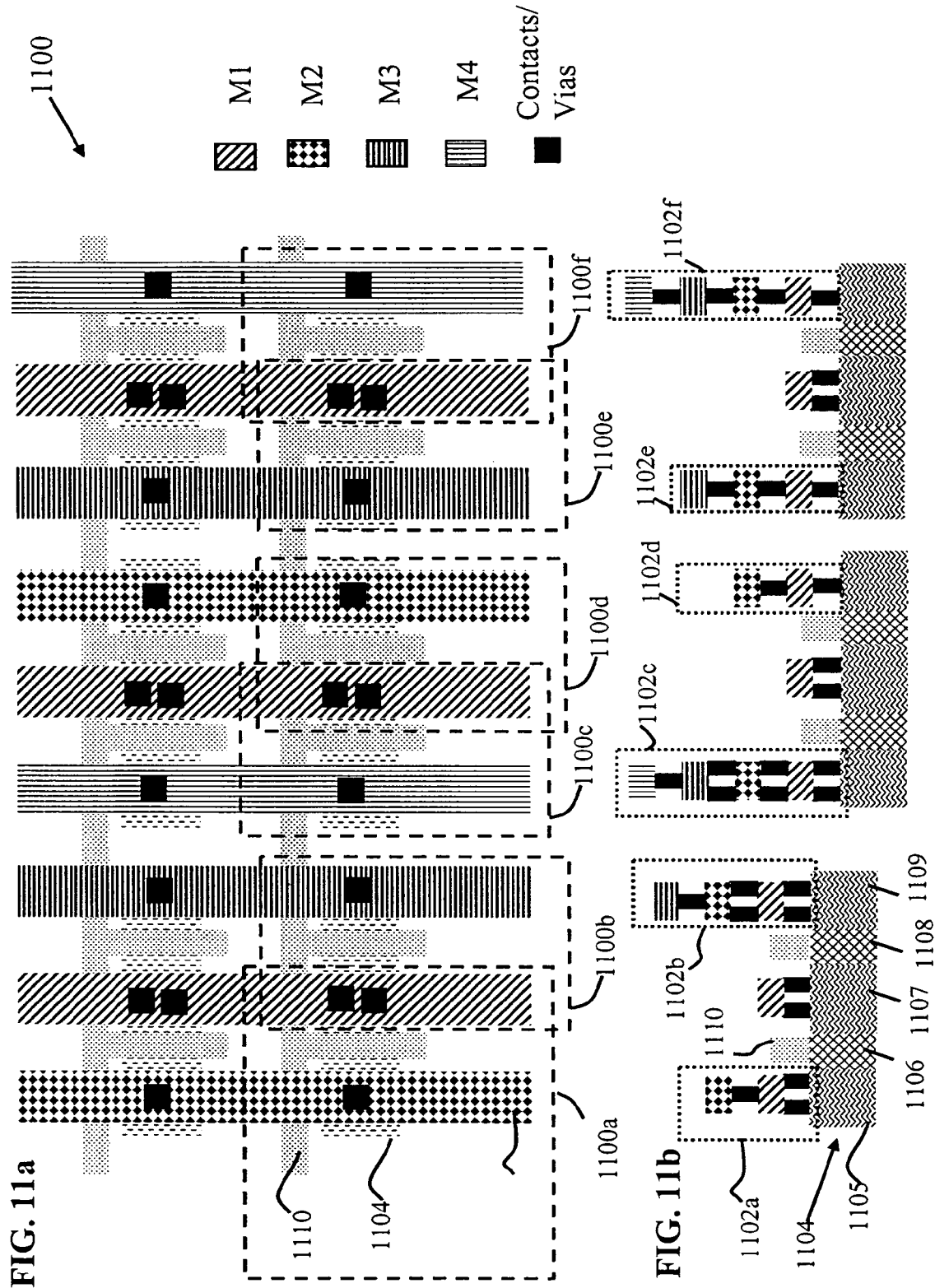
FIGS. 11a and 11b depict aspects of an exemplary array of test cells.

FIGS. 11a and 11b illustrate aspects of an array 1100 of test cells, including test cells 1100a-f. As depicted in FIG. 11b, test cell 1100a includes an active region 1104. As also depicted in FIG. 11b, active region 1104 comprises a drain region 1105, channel region 1106, source region 1107, channel region 1108 and drain region 1109 (described using n-type transistor conventions). Metal interconnect structure 1102a includes double vias coupling drain region 1105 to an M1 island, which is in turn coupled through a single via to an M2 line. A segment of polysilicon line 1110 is disposed over channel region 1106 for controlling formation of a channel between drain region 1105 and source region 1107. Source region 1107 is coupled to an M1 bus/ground line with double vias. The M1 bus/ground line may be continuously coupled with an electrical current source or an electrical current sink. The M1 bus/ground line may also be selectively coupled (for instance when a particular test cell in a test structure is intended to be read) with an electrical current source or an electrical current sink.

Source region 1107 is shared with test cell 110b. Test cell 1100b includes a metal interconnect island 1102b and channel region 1108, over which is disposed another segment of polysilicon line 1110. Test cell 1100 further includes a drain region 1109, which couples to an M1 line of interconnect structure 1102b through double vias, the M1 island in turn couples with an M2 line through a double via, which in turn couples with an M3 line through a single via.

Test cell 1100c comprises interconnect structure 1102c, which is similar to interconnect structure 1102b, and which further includes another via coupling an M2 island and an M3 island (as compared with a single via in interconnect structure 1102b), and an M4 line coupled with the M3 island through a single via.

By contrast with interconnect structure 1102c, interconnect structure 1102d includes a single via coupling active region to M1 and a single via coupling M1 to M2 (rather than the exemplary double contacts/vias of interconnect structures 1102a-c). Thus, interconnect structure 1102d tests alignment of each metal, via, and active layer to layers above and or below that layer (e.g., active to contact, contact to M1, M1 to via, via to M2, etc.). Similar analysis and discussion is appropriate for interconnect structures 1102e-f, with consideration for which metal layers are present in each respective interconnect structure.

Figure 12:
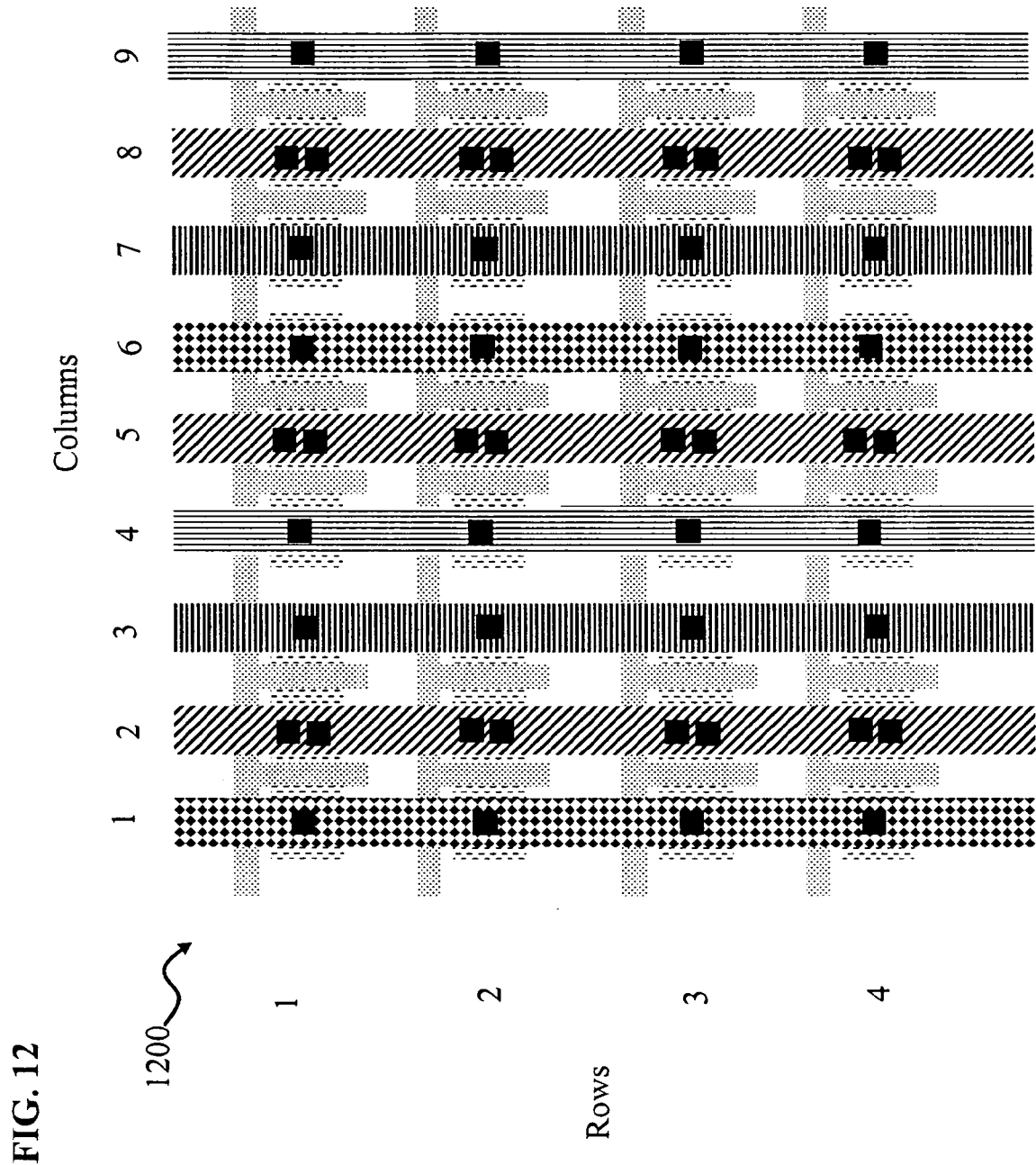
FIG. 12 depicts a top view of an exemplary test structure.

Each of interconnect structures 1102a-f is disposed along a column of test structure 1100 such that each interconnect structure is disposed over a number of active regions arranged in a column of multiple rows (i.e., such as active region 1104). Each row of an interconnect structure may be separately addressed by activating its selection line (e.g., polysilicon line 1110). By example, FIG. 12 illustrates a top view of a test structure 1200 having interconnect structures as described with regard to FIGS. 11a and 11b. Each interconnect structure is identified as a separate column along a top of test structure

1200. Each separately selectable row is also identified. Each row includes a plurality of active regions and each active region including 2 transistors.

Each metal line of each interconnect structure 1102*a-f* may be coupled with one or more current and/or a voltage sensing circuits for detecting whether current flow and/or a change in voltage has occurred on a given metal line. The current and/or voltage sensing circuit(s) may be disposed at a top and/or at a bottom of test structures 1100, 1200.

An example of how test structures 1100 and 1200 may be used to localize metal, contact, and via opens and misalignments is described with respect to test cell 1100*a* of test structure 1100. As discussed above, source region 1107 is coupled with an M1 bus/ground line coupled with one of an electrical current source or an electrical current sink. Thus, upon activation of channel region 1106, a channel may be formed to drain region 1105. Activation of channel region 1106 is controlled by polysilicon line 1110 (which also controls channel region 1108). Current flow and/or voltage changes may then be sensed in any of the metal lines of interconnect structures 1102*a* and 1102*b*. If there is no current flow or no voltage change after gate activation, then that is an indication that there was an open (a failure) somewhere between the active region (e.g., drain 1105) and the metal line sensed.

For instance, if M2 in interconnect structure 1102*a* were sensed, and no current flow or voltage change was detected, then an exemplary diagnosis may proceed as follows. Because drain 1105 is coupled with M1 using double vias, a double via open is an unlikely source of the failure. Instead, it is more likely that there was a via open between M1 and M2, or an open in M2. To determine which of these two possibilities is more likely, test cells both above and below test cell 1100*a* may be activated and the M2 line sensed. If upon activation of one of these other test cells, current flow and/or voltage change is detected, then via failure is more likely the cause. If there continues to be no current flow and/or voltage change, then an open in M2 is more likely the cause.

A similar diagnosis may proceed for interconnect structure 1102*b*. By example, if the M3 line in 1102*b* is sensed and expected current flow is not detected then there is likely an open somewhere in interconnect structure 1102*b*. Because drain 1109 couples with M1 through double vias and M1 couples with M2 with double vias, these are unlikely failure sources. Thus, the failure sources are likely either the via between M2 and M3 or an open in M3. If proper operation of test cells both above and below test cell 1102*b* is detected, then a likely failure is the via. If improper operation is detected then a likely failure is an open in M3. By testing each test cell in the column served by the M3 line in interconnect structure 1102*b*, and determining at what test cell the failure is detectable, a likely location for the M3 open may be determined. Similar analysis may be conducted for interconnect structure 1102*c*.

Analysis for interconnect structures 1102*d-f* may proceed as follows. Each of interconnect structures 1102*d-f* include a single contact or via coupling each layer of a given interconnect structure. By example, upon activating test cell 1100*d*, current flow and/or voltage changes may be sensed on the M2 line of interconnect structure 1102*d*. Absence of current flow and/or voltage changes indicates a fault. If there is such on the M2 line, then there is a problem with either the via between M1 and M2, with an M2 open, or with alignment of one or more of the foregoing. Test cells both above and below test cell 1100*d* that share the M2 line may be activated, and M2 sensed for current and/or voltage change. If there is current and/or voltage change, then the single M1 to M2 via or M1 to active contact has likely failed (or is misaligned). Similar analysis may be conducted for interconnect structures 1102*e-f* for each metal layer in interconnect structures 1102*e-f*.

Figure 13:
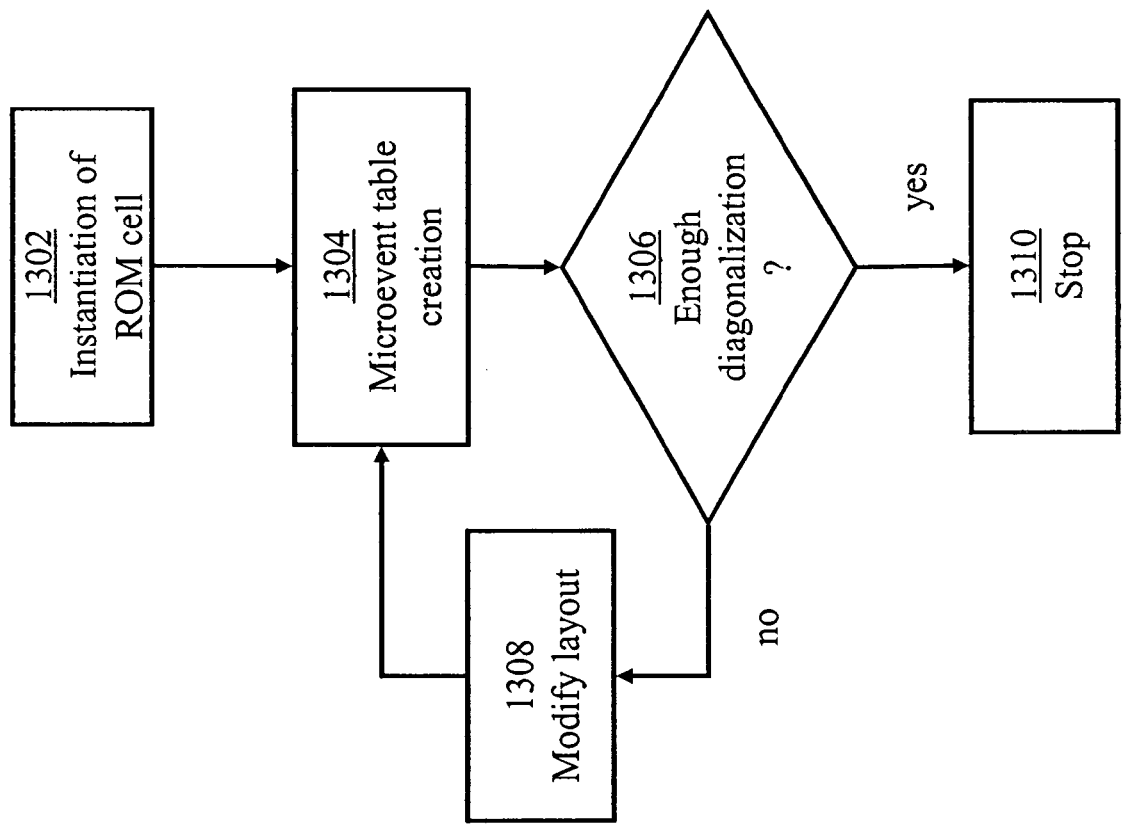
FIG. 13 depicts an exemplary process of optimizing the design of a ROM.

Design Methodology:

FIG. 13 shows an exemplary process of further optimizing the design of ROM based test structures, such as those described above. The failure modes illustrated in Tables 1 and 2 above, and others embodied in the text above, can be accentuated or detuned by making slight changes in the layout. For example, in the failure mode of Table 2, the relative importance of metal opens versus via opens can be tuned by either adding double vias and using narrow lines (accentuates metal open detectability) or by using single vias and using wide lines (accentuates via open detectability) or by something in between.

As depicted in FIG. 13, the present exemplary process begins at step 1302 with an initial design of the test structures in the test cell. In step 1304, a failure event matrix (depicted as a microevent table in FIG. 13) is created for the design (such as Tables 1, 2). The failure event matrix can be either qualitative (such as Tables 1 and 2) or quantitative (expressing a probability of such failure mode occurring given current process condition) or semi-quantitative (expressing more-likely and less-likely behaviors).

In step 1306, the failure event matrix is examined to determine an extent of diagonalization of the failure event matrix. In the ideal case, the failure event matrix is perfectly diagonal (as shown in Table 2) in which one failure mode can be identically assigned to one electrical symptom. This is termed perfect localization. Table 1 shows a case in which the table is mostly diagonal as both single bit failures and entire SL failures can be mapped to more than one failure mode.

In step 1308, if the failure event matrix is insufficiently diagonalized (e.g., less than an acceptable threshold of diagonalization), the current design is modified and steps 1304 and 1306 are repeated. In step 1310, if the failure event matrix is sufficiently diagonalized (e.g., above an acceptable threshold of diagonalization), the optimization is stopped and the current design is accepted as the final design. Thus, the design can be iteratively modified until an acceptable design is obtained or until all reasonable options have been considered.

It should be recognized that the exemplary process depicted in FIG. 13 and described above can be applied to any of the test structure and/or cell described above or any other type of test structure and/or test cell. It should also be recognized that multiple designs can be optimized in performing the exemplary process depicted in FIG. 13, then the optimized results can be compared to each other to judge the best design.

Various test cells for test structures and arrangements of test cells into test structures been illustrated and described herein. One of ordinary skill in the art would understand that teachings related to each test cell and test structure may be adapted for use in other test cells and test structures. Test structures may be extended to use in processes with more metal layers and with other transistor varieties, and for various process types. Other modifications and variations would also be apparent to those of ordinary skill in the art from the exemplary aspects presented. Additionally, particular examples have been discussed and how these examples are thought to address certain disadvantages in related art. This discussion is not meant, however, to restrict the various examples to methods and/or systems that actually address or solve the disadvantages.

We claim:

1. A method of fabricating an integrated circuit chip, the method comprising:

forming a first active region on a portion of a test wafer using an integrated circuit fabrication line;
forming a second active region substantially parallel to the first active region on the portion of the test wafer;
forming a third active region substantially parallel to the first and second active regions on the portion of the test wafer;
forming a fourth active region formed between the first and second active regions on the portion of the test wafer;
forming a fifth active region formed between the second and third active regions on the portion of the test wafer,
wherein the fourth and fifth active regions are formed adjacent to opposite end portions of the second active region, and
wherein the fourth and fifth active regions are formed substantially perpendicular to the second active region;
examining the portion of the test wafer to detect and localize defects;
adjusting the integrated circuit fabrication line based on the examination of the portion of the test wafer;
fabricating integrated circuit dice on a production wafer using the adjusted integrated circuit fabrication line;
dicing the integrated circuit dice on the production wafer into integrated circuit chips; and
packaging the integrated circuit chips;
the method further including:
forming a first selection line segment disposed over a portion of the fourth active region;
forming a second selection line segment disposed over a portion of the fifth active region, wherein the first and second selection line segments run substantially parallel to the first, second, and third active regions;
forming a first sense line segment disposed over first end portions of the first, second, and third active regions;
forming a second sense line segment dispose over second end portions of the first, second, and third active regions, wherein the first and second end portions are opposite ends of the first, second, and third active regions, wherein the first and second sense line segments run substantially perpendicular to the first and second selection line segments; and
forming a bus line segment disposed over middle portions of the first, second, and third active regions, wherein the bus line segment runs between the first and second sense line segments;
wherein:
a first transistor is defined by the first active region, the second active region the fourth active region, the first selection line segment, portions of the first and second sense lines, and a portion of the bus line segment; and
a second transistor is defined by the second active region, the third active region, the fifth active region, the second selection line segment, portions of the first and second sense lines, and a portion of the bus line segment.

2. The method of claim 1, wherein the first and second transistors are defined by four quadrants with each quadrant corresponding to a bit location, and further comprising:
after forming the first, second, third, fourth, and fifth active regions, the first and second selection line segments, the first and second sense line segments, and the bus line segment:
providing a source of electricity to the bus line segment;
activating the first selection line segment;
activating the second selection line segment;
sensing for a voltage change or electric current flow on the first sense line segment to read one or more of the quadrants to detect and localize a failure to one or more of the quadrants; and
sensing for a voltage change or electric current flow on the second sense line segment to read one or more of the quadrants to detect and localize a failure to one or more of the quadrants.

3. The method of claim 2, wherein the fourth active region is formed adjacent to the second end portions of the first and second active regions, wherein the fifth active region is formed adjacent to the first end portions of the second and third active regions, and further comprising:
a first contact formed between the first end portion of the first active region and the first sense line segment disposed over the first end portion of the first active region;
a second contact formed between the middle portion of the second active region and the bus line segment disposed over the middle portion of the second active region; and
a third contact formed between the second end portion of the third active region and the second sense line segment disposed over the second end portion of the third active region.

4. The method of claim 3, further comprising:
detecting a failure in one or more of:
the first active region;
the third active region;
the first contact;
the second contact;
the first selection line segment;
the second selection line segment;
the first sense line segment;
the second sense line segment;
the bus line segment;
between the bus line and the first or second sense line segments; and
between one of the sense line segments and one of the selection line segments.

5. The method of claim 3, further comprising:
determining an open exists in the second contact if a voltage change or current flow was not sensed on either the first sense line segment or the second sense line segment;
determining an open exists in the second contact if a voltage or current was not sensed on either the first sense line segment or the second sense line segment;
determining an open exists in the first contact if a voltage or current was not sensed on the first sense line segment but sensed on the second sense line segment; and
determining an open exists in the second contact if a voltage or current was not sensed on the second sense line segment but sensed on the first sense line segment.

6. A method of fabricating an integrated circuit chip, the method comprising:
fabricating integrated circuit dice on a wafer using an integrated circuit fabricated line;
forming a first active region on a portion of a scribe area on the wafer between two adjacent integrated circuit dice on the wafer using the integrated circuit fabrication line;
forming a second active region substantially parallel to the first active region on the portion of the scribe area;
forming a third active region substantially parallel to the first and second active regions on the portion of the scribe area;
forming a fourth active region formed between the first and second active regions on the portion of the scribe area;
forming a fifth active region formed between the second and third active regions on the portion of the scribe area, wherein the fourth and fifth active regions are formed adjacent to opposite end portions of the second active region, and wherein the fourth and fifth active regions are formed substantially perpendicular to the second active region;

dicing the integrated circuit dice on the wafer along the scribe area into integrated circuit chips; and packaging the integrated circuit chips;

the method further including:

forming a first selection line segment disposed over a portion of the fourth active region;

forming a second selection line segment disposed over a portion of the fifth active region, wherein the first and second selection line segments run substantially parallel to the first, second, and third active regions;

forming a first sense line segment disposed over first end portions of the first, second, and third active regions;

forming a second sense line segment dispose over second end portions of the first, second, and third active regions, wherein the first and second end portions are opposite ends of the first, second, and third active regions, wherein the first and second sense line segments run substantial) perpendicular to the first and second selection line segments; and forming a bus line segment disposed over middle portions of the first, second, and third active regions, wherein the bus line segment runs between the first and second sense line segments;

wherein:

a first transistor is defined by the first active region, the second active region, the fourth active region, the first selection line segment, portions of the first and second sense lines, and a portion of the bus line segment; and a second transistor is defined by the second active region, the third active region, the fifth active region, the second selection line segment, portions of the first and second sense lines, and a portion of the bus line segment.

7. The method of claim 6, further comprising:

before dicing the integrated circuit dice, examining the portion of the scribe area on the wafer to detect and localize defects;

adjusting the integrated circuit fabrication line based on the examination of the portion of the scribe area;

fabricating integrated circuit dice on a subsequent wafer using the adjusted integrated circuit fabrication line;

dicing the integrated circuit dice on the subsequent wafer into integrated circuit chips; and packaging the integrated circuit chips.

8. The method of claim 6, wherein the first and second transistors are defined by four quadrants with each quadrant corresponding to a bit location, and further comprising:

after forming the first, second, third, fourth, and fifth active regions, the first and second selection line segments, the first and second sense line segments, and the bus line segment:

providing a source of electricity to the bus line segment;

activating the first selection line segment;

activating the second selection line segment;

sensing for a voltage change or electric current flow on the first sense line segment to read one or more of the quadrants to detect and localize a failure to one or more of the quadrants; and sensing for a voltage change or electric current flow on the second sense line segment to read one or more of the quadrants to detect and localize a failure to one or more of the quadrants.

9. The method of claim 8, wherein the fourth active region is formed adjacent to the second end portions of the first and second active regions, wherein the fifth active region is formed adjacent to the first end portions of the second and third active regions, and further comprising:

a first contact formed between the first end portion of the first active region and the first sense line segment disposed over the first end portion of the first active region;

a second contact formed between the middle portion of the second active region and the bus line segment disposed over the middle portion of the second active region; and a third contact formed between the second end portion of the third active region and the second sense line segment disposed over the second end portion of the third active region.

10. The method of claim 9, further comprising:

detecting a failure in one or more of:

the first active region;

the third active region;

the first contact;

the second contact;

the first selection line segment;

the second selection line segment;

the first sense line segment;

the second sense line segment;

the bus line segment;

between the bus line and the first or second sense line segments; and between one of the sense line segments and one of the selection line segments.

11. The method of claim 9, further comprising:

determining an open exists in the second contact if a voltage change or current flow was not sensed on either the first sense line segment or the second sense line segment;

determining an open exists in the second contact if a voltage or current was not sensed on either the first sense line segment or the second sense line segment;

determining an open exists in the first contact if a voltage or current was not sensed on the first sense line segment but sensed on the second sense line segment; and determining an open exists in the second contact if a voltage or current was not sensed on the second sense line segment but sensed on the first sense line segment.

12. A method of fabricating an integrated circuit chip, the method comprising:

forming a first active region on a portion of a test wafer using an integrated circuit fabrication line;

forming a second active region substantially parallel to the first active region on the portion of the test wafer;

forming a third active region substantially parallel to the first and second active regions on the portion of the test wafer;

forming a fourth active region formed between the first and second active regions on the portion of the test wafer;

forming a fifth active region formed between the second and third active regions on the portion of the test wafer, wherein the fourth and fifth active regions are formed adjacent to opposite end portions of the second active region, and wherein the fourth and fifth active regions are formed substantially perpendicular to the second active region;

examining the portion of the test wafer to detect and localize defects;

adjusting the integrated circuit fabrication line based on the examination of the portion of the test wafer;

fabricating integrated circuit dice on a production wafer using the adjusted integrated circuit fabrication line;

dicing the integrated circuit dice on the production wafer into integrated circuit chips; and packaging the integrated circuit chips;

the method further including:

forming a first selection line segment disposed over a portion of the fourth active region;

forming a second selection line segment disposed over a portion of the fifth active region, wherein the first and second selection line segments run substantially parallel to the first, second, and third active regions;

forming a first sense line segment disposed over first end portions of the first, second, and third active regions;

forming a second sense line segment dispose over second end portions of the first, second, and third active regions, wherein the first and second end portions are opposite ends of the first, second, and third active regions, wherein the first and second sense line segments run substantially perpendicular to the first and second selection line segments; and forming a bus line segment disposed over middle portions of the first, second, and third active regions, wherein the bus line segment runs between the first and second sense line segments;

wherein the fourth active region is formed adjacent to the first end portions of the first and second active regions, wherein the fifth active region is formed adjacent to the second end portions of the second and third active regions, and further comprising:

a first contact formed between the second end portion of the first active region and the second sense line segment disposed over the second end portion of the first active region;

a second contact formed between the middle portion of the second active region and the bus line segment disposed over the middle portion of the second active region; and a third contact formed between the first end portion of the third active region and the first sense line segment disposed over the first end portion of the third active region.

13. A method of fabricating an integrated circuit chip, the method comprising:

fabricating integrated circuit dice on a wafer using an integrated circuit fabricated line;

forming a first active region on a portion of a scribe area on the wafer between two adjacent integrated circuit dice on the wafer using the integrated circuit fabrication line;

forming a second active region substantially parallel to the first active region on the portion of the scribe area;

forming a third active region substantially parallel to the first and second active regions on the portion of the scribe area;

forming a fourth active region formed between the first and second active regions on the portion of the scribe area;

forming a fifth active region formed between the second and third active regions on the portion of the scribe area, wherein the fourth and fifth active regions are formed adjacent to opposite end portions of the second active region, and wherein the fourth and fifth active regions are formed substantially perpendicular to the second active region;

dicing the integrated circuit dice on the wafer along the scribe area into integrated circuit chips; and packaging the integrated circuit chips;

the method further including:

forming a first selection line segment disposed over a portion of the fourth active region;

forming a second selection line segment disposed over a portion of the fifth active region, wherein the first and second selection line segments run substantially parallel to the first, second, and third active regions;

forming a first sense line segment disposed over first end portions of the first, second, and third active regions;

forming a second sense line segment dispose over second end portions of the first, second, and third active regions, wherein the first and second end portions are opposite ends of the first, second, and third active regions, wherein the first and second sense line segments run substantially perpendicular to the first and second selection line segments; and forming a bus line segment disposed over middle portions of the first, second, and third active regions, wherein the bus line segment runs between the first and second sense line segments;

wherein the fourth active region is formed adjacent to the first end portions of the first and second active regions, wherein the fifth active region is formed adjacent to the second end portions of the second and third active regions, and further comprising:

a first contact formed between the second end portion of the first active region and the second sense line segment disposed over the second end portion of the first active region;

a second contact formed between the middle portion of the second active region and the bus line segment disposed over the middle portion of the second active region; and a third contact formed between the first end portion of the third active region and the first sense line segment disposed over the first end portion of the third active region.

* * * * *